(12) United States Patent
Varpula et al.

(10) Patent No.: US 11,199,455 B2
(45) Date of Patent: Dec. 14, 2021

(54) THERMAL DETECTOR AND THERMAL DETECTOR ARRAY

(71) Applicant: TEKNOLOGIAN TUTKIMUSKESKUS VTT OY, Espoo (FI)

(72) Inventors: Aapo Varpula, Vtt (FI); Bin Guo, Vtt (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 6 days.

(21) Appl. No.: 16/642,939

(22) PCT Filed: Aug. 31, 2018

(86) PCT No.: PCT/FI2018/050619
§ 371 (c)(1),
(2) Date: Feb. 28, 2020

(87) PCT Pub. No.: WO2019/043299
PCT Pub. Date: Mar. 7, 2019

(65) Prior Publication Data
US 2020/0309603 A1    Oct. 1, 2020

(30) Foreign Application Priority Data
Aug. 31, 2017   (FI) .................................. 20175779

(51) Int. Cl.
*G01J 5/20* (2006.01)
*G01J 5/02* (2006.01)
(Continued)

(52) U.S. Cl.
CPC ............... *G01J 5/20* (2013.01); *G01J 5/0215* (2013.01); *G01J 5/045* (2013.01); *G01J 5/084* (2013.01);
(Continued)

(58) Field of Classification Search
CPC ...................................................... G01J 5/20
See application file for complete search history.

(56) References Cited

U.S. PATENT DOCUMENTS 7,015,457 B2 *  3/2006  Cole ...................... G02B 5/284
                                                       250/226
7,417,746 B2 *  8/2008  Lin ........................... G01J 3/02
                                                       356/519
(Continued)

FOREIGN PATENT DOCUMENTS

DE    10 2016 122 850      6/2017
EP         0 800 643      10/1997
(Continued)

OTHER PUBLICATIONS

Machine Translation of JP 2000-298063 (Year: 2000).*
(Continued)

*Primary Examiner* — Yara B Green
(74) *Attorney, Agent, or Firm* — Nixon & Vanderhye PC

(57) ABSTRACT

A wafer-level integrated thermal detector comprises a first wafer and a second wafer (W1, W2) bonded together. The first wafer (W1) includes a dielectric or semiconducting substrate (100), a dielectric sacrificial layer (102) deposited on the substrate, a support layer (104) deposited on the sacrificial layer or the substrate, a suspended active element (108) provided within an opening (106) in the support layer, a first vacuum-sealed cavity (110) and a second vacuum-sealed cavity (106) on opposite sides of the suspended active element. The first vacuum-sealed cavity (110) extends into the sacrificial layer (102) at the location of the suspended active element (108). The second vacuum-sealed cavity (106) comprises the opening of the support layer (104) closed by the bonded second wafer. The thermal detector further comprises front optics (120) for entrance of radiation from outside into one of the first and second vacuum-sealed
(Continued)

cavities, aback reflector (112) arranged to reflect radiation back into the other one of the first and second vacuum-sealed cavities, and electrical connections (114) for connecting the suspended active element to a readout circuit (118).

21 Claims, 10 Drawing Sheets

(51) Int. Cl.

| | |
|---|---|
| *G01J 5/04* | (2006.01) |
| *G01J 5/08* | (2006.01) |
| *H01L 25/18* | (2006.01) |
| *H01L 27/144* | (2006.01) |
| *H01L 27/16* | (2006.01) |
| *H01L 31/02* | (2006.01) |
| *H01L 31/0232* | (2014.01) |
| *H01L 37/02* | (2006.01) |

(52) U.S. Cl.
CPC ........... *G01J 5/0806* (2013.01); *G01J 5/0809* (2013.01); *H01L 25/18* (2013.01); *H01L 27/1446* (2013.01); *H01L 27/16* (2013.01); *H01L 31/02016* (2013.01); *H01L 31/02325* (2013.01); *H01L 37/02* (2013.01); *B81B 2201/0207* (2013.01)

(56) References Cited

U.S. PATENT DOCUMENTS

| | | |
|---|---|---|
| 2008/0164413 A1* | 7/2008 | Shibayama ............. H01L 24/97 250/338.4 |
| 2010/0140618 A1 | 6/2010 | Reinmuth et al. |
| 2010/0314544 A1 | 12/2010 | Ouvrier-Buffet |
| 2011/0266443 A1 | 11/2011 | Schimert et al. |
| 2014/0294043 A1 | 10/2014 | Samarao et al. |
| 2016/0054179 A1 | 2/2016 | Carr |
| 2016/0163942 A1 | 6/2016 | Emadi et al. |

FOREIGN PATENT DOCUMENTS

| | | | |
|---|---|---|---|
| JP | 2000-298063 | * | 10/2000 |
| WO | WO 96/21140 | | 7/1996 |
| WO | WO 2008/073261 | | 6/2008 |

OTHER PUBLICATIONS

International Search Report issued in PCT/FI2018/050619 dated Jan. 10, 2019.
Written Opinion of the International Searching Authority issued in PCT/FI2018/050619 dated Jan. 10, 2019.
Search Report issued in FI Appln. No. 20175779 dated Apr. 26, 2018.

* cited by examiner

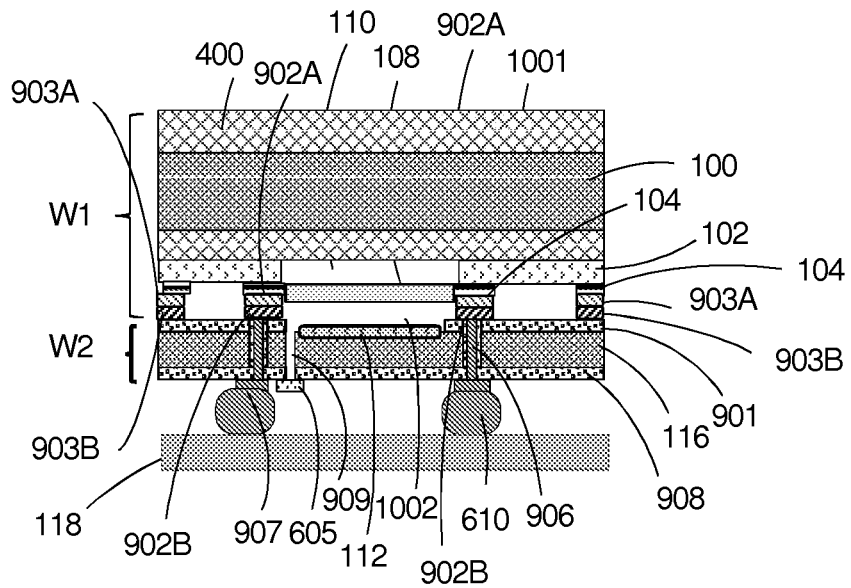
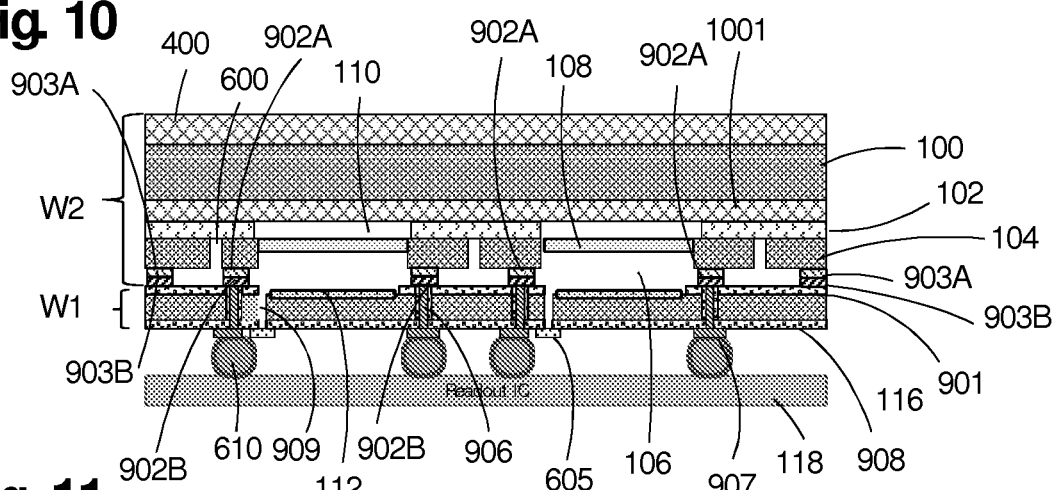
Fig. 10
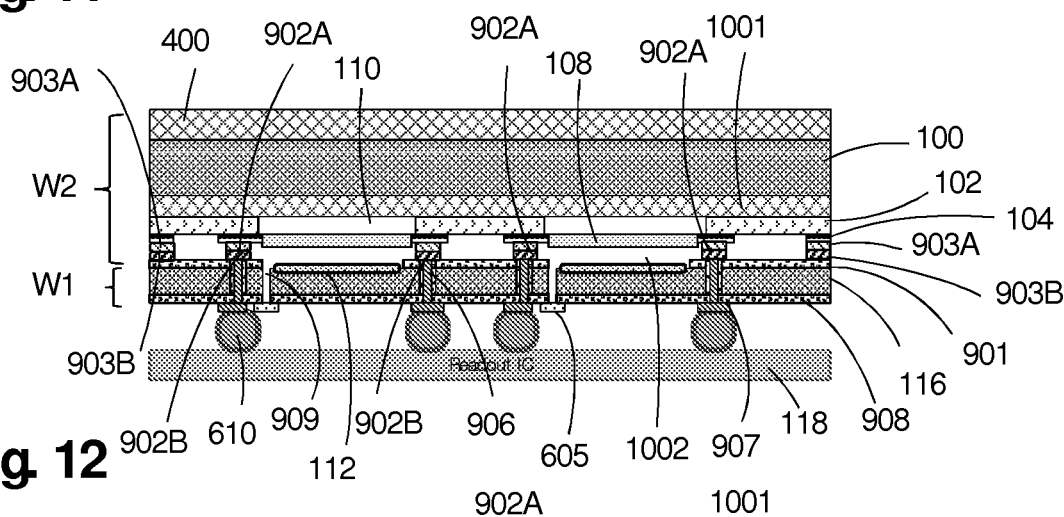
Fig. 11
Fig. 12

THERMAL DETECTOR AND THERMAL DETECTOR ARRAY

This application is the U.S. national phase of International Application No. PCT/FI2018/050619 filed Aug. 31, 2018 which designated the U.S. and claims priority to FI Patent Application No. 20175779 filed Aug. 31, 2017, the entire contents of each of which are hereby incorporated by reference.

FIELD OF THE INVENTION

The invention relates to thermal sensors or detectors, and particularly to suspended thermal sensors or detectors, such as resistive or thermoelectric bolometers.

BACKGROUND OF THE INVENTION

In a thermal detector the incident IR photons are absorbed by a thermally isolated detector element, resulting in a change in the temperature of the element. The resulting increase in temperature is a function of the radiant energy striking the bolometer. The temperature change alters a temperature sensitive electric property of the detector, which can be measured externally, e.g. with thermoelectric, pyroelectric, resistive or other temperature sensing principles. The circuitry used to perform the measurement is commonly known as the Read Out Integrated Circuit (ROIC), and is typically fabricated as an integrated circuit on a silicon substrate. The thermal detector may be arranged to absorb electromagnetic radiation of various types, such as ultraviolet (UV) light, visible light, infrared (IR) light, Tera-Hertz (THz) radiation, and X-rays.

Thermal detectors require a temperature change to produce a signal and do not generally need cooling, in contrast to photo detectors which are cooled to minimize noise. Since these detectors depend on temperature changes resulting from incident radiation, they must be thermally isolated from their surroundings and have low thermal capacities for fast response to the radiation.

An exemplary schematic representation of a conventional suspended detector, e.g. a microbolometer, is shown in FIG. 1. The electromagnetic radiation is typically absorbed by an absorbing membrane 10 suspended above suspended above a reflecting metal layer 12 by means of heat-insulating arms 9 fixed to a substrate 13 via anchoring points or support studs 8. The membrane 10 is thermally isolated from the substrate to increase the sensitivity of the microbolometer. The absorbed incident radiation causes the thermally isolated bolometer membrane to increase its temperature. The temperature change correlates to the energy of the absorbed radiation and is measured by a change of a measurable electrical parameter, such as the electrical resistance of a bolometer thermistor material in the membrane. A resonant cavity 11 is formed between the membrane 10 and the reflecting metal layer 12. The cavity 11 is used to both amplify the absorbance of the incident IR radiation and to provide thermal insulation.

Microbolometer detector arrays may be used to sense a focal plane of incident radiation (typically infrared). Ensembles of thermal detectors in two-dimensional arrays are called focal plane arrays (FPAs). With each microbolometer functioning as a pixel, a two-dimensional image or picture representation of the incident infrared radiation may be generated by translating the changes in resistance of each microbolometer into a time-multiplexed electrical signal that can be displayed on a monitor or stored in a computer. The circuitry used to perform this translation is commonly known as the Read Out Integrated Circuit (ROIC), and is commonly fabricated as an integrated circuit on a silicon substrate. The microbolometer array may then be fabricated on top of the ROIC.

Because microbolometers do not undergo any cooling, the absorbing material must be thermally isolated from the bottom ROIC and the suspended structure allows for this to occur. After the array of pixels is created the microbolometer is encapsulated under a vacuum to increase the longevity of the device. In some cases the entire fabrication process is done without breaking vacuum. An important advantage for MEMS based bolometer arrays is the possibility this technology offers for low cost wafer level vacuum packaging. One approach is a wafer scale package which form lids with silicon IR-window over the bolometer pixel or pixel array FPA provided on the ROIC substrate wafer.

MEMS-Based Uncooled Infrared Bolometer Arrays—A Review, F Niklaus et al, MEMS/MOEMS Technologies and Applications III, Proc. of SPIE Vol. 6836, 68360D, (2007), gives an overview of the historical development of uncooled infrared bolometer technology, different technology concepts, bolometer design approaches and bolometer materials.

Review Article: Integrating MEMS and ICs, AC Fischer et al, Microsystems & Nanoengineering (2015) 1, 15005; doi:10.1038/micronano.2015.5; 28 May 2015, discloses different approaches for integrating and packaging microelectromechanical system (MEMS) devices and integrated circuit (IC) components. These include approaches based on the hybrid integration of multiple chips (multi-chip solutions) as well as system-on-chip solutions based on wafer-level monolithic integration and heterogeneous integration techniques.

Direct wafer bonding for MEMS and microelectronics, Suni T., VTT Publications 609, Espoo 2006, ISBN 951-38-6851-6, discloses direct wafer bonding processes.

Silicon-based surface micromachined interferometers for infrared wavelengths, Mikko Tuohiniemi, Aalto University publication series, Doctoral dissertations 54/2015, 18 Mar. 2015, ISBN 978-952-60-6177-8, discloses examples of the concept, structure, and fabrication process for a MEMS Fabry-Pérot interferometer (FPI). FPI is a tunable optical band-pass filter. Also dielectric multilayer mirror, the distributed Bragg reflector (DBR), structures are disclosed, and particularly, the use of micro-electro-mechanical systems (MEMS) to produce a miniature FPI based on a particular type of the DBR of silicon-air multilayer is outlined.

Suspended Large-Area Mems-Based Optical Filters, Tripathi et al, Journal of Microelectromechanical Systems, August 2015, p. 1102-1110, discloses a tunable Fabry-Pérot cavity hybrid bonded to a detector or imaging FPA.

BRIEF DESCRIPTION OF THE INVENTION

An aspect of the present invention is to provide new wafer-level integrated suspended thermal detector structures. Aspects of the invention include wafer-level integrated suspended thermal detectors, detector arrays and prefabricated intermediate products according the independent claims. Preferred embodiments of the invention are disclosed in the dependent claims.

An aspect of the invention is a wafer-level integrated thermal detector, comprising a first wafer and a second wafer bonded together, wherein the first wafer includes a dielectric or semiconducting substrate, a wafer-wide or patterned lo-cal dielectric sacrificial layer deposited on the substrate, a support layer deposit-ed on the dielectric or semiconducting sacrificial layer or the substrate, a sus-pended active element provided within an opening in the support layer, a first vacuum-sealed cavity and a second vacuum-sealed cavity on opposite sides of the suspended active element, wherein the first vacuum-sealed cavity extends into the sacrificial layer at the location of the sus-pended active element, and the second vacuum-sealed cavity comprises the opening of the support layer closed by the bonded second wafer, front optics for entrance of radiation from outside into one of the first and second vacuum-sealed cavities, a back reflector arranged to reflect radiation back into the other one of the first and second vacuum-sealed cavities, and electrical connections for connecting the suspended active element to a readout circuit.

In an embodiment of the thermal detector, the first wafer and the second wafer are wafer bonded using fusion-acti-vated bonding or plasma-activated bonding or thermocom-pression bonding or another type of metal-based wafer bonded.

In an embodiment of the thermal detector, the electrical connections are configured to be connected to an integrated readout circuit on a third wafer, preferably by a thermocom-pression bonding or another type of metal-based bonding or a chip bonding.

In an embodiment of the thermal detector, the front optics comprises one or more of: a transparent substrate, a window in a substrate, an anti-reflective coating, a lens, a filter, a front mirror, a controllable moving front mirror, a Fabry-Pérot interferometer, a tuneable Fabry-Pérot interferometer.

In an embodiment of the thermal detector, the back reflector comprises one or more of: a back mirror, a metal back mirror, a Distributed Bragg reflector, a controllable moving back mirror, a Fabry-Pérot interferometer, a tune-able Fabry-Pérot interferometer.

In an embodiment of the thermal detector, the back reflector is provided on an inner side of the other one of the first and second wafers, or on outer side of the other one of the first and second wafers behind a transparent substrate or a window, or in an opening provided in the other one of the first and second wafers.

In an embodiment of the thermal detector, the support layer further comprises a thinner shoulder portion on a periphery of the opening for mechanical and electrical connection of the sus-pended active element, and wherein the thinner shoulder portion is preferably offset from a bonded surface of the first wafer.

In an embodiment of the thermal detector, the back reflector is provided on an inner side of the other one of the first and second wafers, or on an outer side of the other one of the first and second wafers behind a transparent substrate or a window, or in an opening provided in the other one of the first and second wafers.

In an embodiment of the thermal detector, the thermal detector further comprises a movable reflector of a Fabry-Pérot interferometer in one of the first and second vacuum-sealed cavities, wherein a vacuum space is present on both sides of the movable reflector.

In an embodiment of the thermal detector, both a fixed reflector and the movable reflector of the Fabry-Pérot inter-ferometer are arranged in the same one of the first and second vacuum-sealed cavities on a front side of the sus-pended active element.

In an embodiment of the thermal detector, the movable reflector is arranged in the one of the first and second vacuum-sealed cavities on a back side of the suspended active element.

In an embodiment of the thermal detector, the movable reflector is configured to operate as said back reflector.

In an embodiment of the thermal detector, a fixed reflector of the Fabry-Pérot interferometer is arranged on a front side of the suspended active element.

In an embodiment of the thermal detector, the thermal detector further comprises a support structure arranged to mechanically support the movable reflector within the one of the first and second vacuum-sealed cavities.

In an embodiment of the thermal detector, the thermal detector further comprises electrical connections arranged to connect the movable reflector to an actuation control for tuning the Fabry-Pérot interferometer.

In an embodiment of the thermal detector, the electrical connections of the movable reflector comprise a pair of electrostatic actuation electrodes.

In an embodiment of the thermal detector, the thermal detector is arranged to absorb electromagnetic radiation in one of the following wavelength ranges: ultraviolet (UV) light, visible light, in-frared (IR) light, Tera-Hertz (THz) radiation, and X-rays.

An aspect of the invention is an integrated thermal detector array comprising a plurality of thermal detectors according to any embodiment thereof.

An aspect of the invention is a prefabricated intermediate product for manufacture of an integrated thermal detector according to any embodiment thereof or an integrated ther-mal detector array according to any embodiment thereof, comprising the first wafer prefabricated to include the sub-strate, the suspended active device, the support layer, and the dielectric sacrificial layer supporting the suspended active device.

In an embodiment of a prefabricated intermediate prod-uct, the first wafer is further prefabricated to include a Fabry-Pérot interferometer, a fixed reflector of a Fabry-Pérot interferometer, or a movable reflector of a Fabry-Pérot interferometer on the inner side of the first wafer.

An aspect of the invention is a prefabricated intermediate product for manufacture of the integrated thermal detector according to any embodiment thereof or the integrated thermal detector array according to any embodiment thereof, comprising the second wafer pre-fabricated to include a dielectric or semiconducting substrate and a movable reflec-tor of a Fabry-Pérot interferometer on the inner side of the second wafer.

BRIEF DESCRIPTION OF THE DRAWINGS

In the following the invention will be described in greater detail by means of exemplary embodiments with reference to the accompanying drawings, in which

FIG. 10 shows schematic representation of a further exemplary suspended detector 20 according to an aspect of the invention using thermocompression wafer bonding;

FIG. 11 shows a schematic representation of exemplary suspended detector array comprising a plurality of thermal detectors according the aspect of the invention according to an aspect of the invention using thermocompression wafer bonding;

FIG. 12 shows a schematic representation of exemplary suspended detector array comprising a plurality of thermal detectors according to an aspect of the invention using thermocompression wafer bonding;

DETAILED DESCRIPTION OF THE INVENTION

Figure 1:
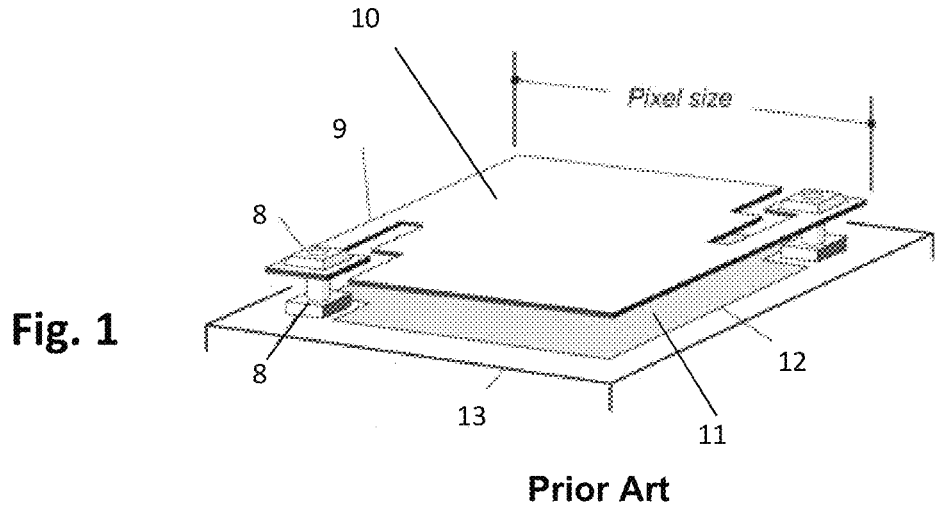
FIG. 1 shows a schematic representation of an exemplary conventional suspended detector.
Figure 2A:
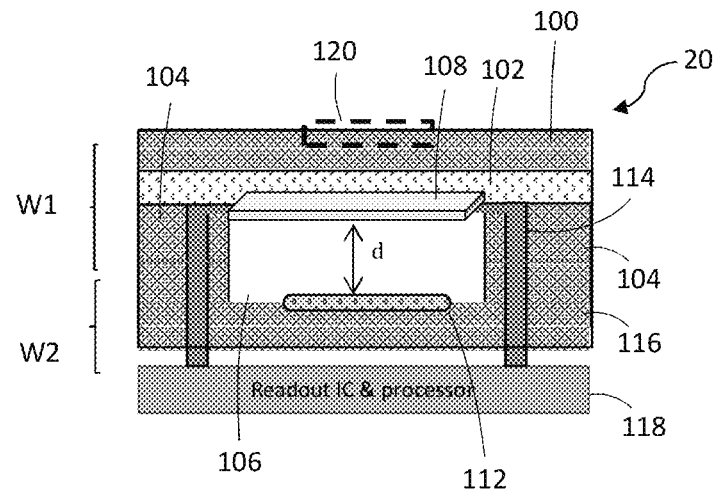
FIGS. 2A and 2B show schematic representations of an exemplary suspended detector according to an aspect of the invention.
Figure 2B:
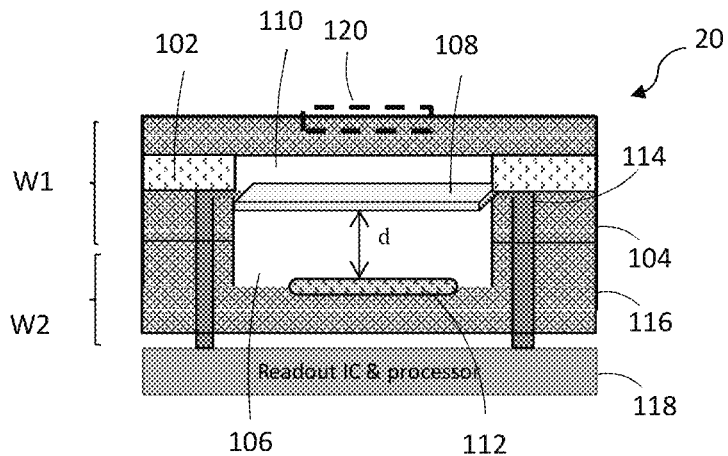

It should be appreciated that schematic drawings presented herein may not show various optional, alternative, and preferred features and details that may be present in a detector, such as electric insulation layers, vacuum-sealing layers, protective layers, antireflective layers, bonding layers, etc. Examples of such features are given in different embodiments further below. Examples of detailed fabrication processes and materials for fabrication of MEMS devices on dielectric or semiconducting substrates, and for wafer bonding are given in the above-mentioned publications "Silicon-based surface micromachined interferometers for infrared wavelengths" by Tuohiniemi and "Direct wafer bonding for MEMS and microelectronics" by Suni, which publications are incorporated by reference herein. Embodiments of the invention are applicable in wide range of wavelengths, including ultraviolet (UV) light, visible light, infrared (IR) light, Tera-Hertz (THz) radiation, and X-rays. Examples of dielectric substrate materials include silicon oxide ($SiO_2$) and aluminium oxide ($Al_2O_3$). $SiO_2$ or $Al_2O_3$ can be used especially for wavelengths less than 4 µm. An examples of semiconducting substrate materials are single-crystalline or polycrystalline silicon, also called polysilicon or poly-Si, germanium (Ge), and compound semiconductors such as CdTe, ZnSe, and ZnS. Embodiments of the invention may be applied with any type of suspended active thermal element, such as thermoelectric element, resistive thermal element or thermal element based on active semiconductor components where temperature is sensed using temperature dependence of electric properties of the semiconductor device (for example current-voltage curve). FIGS. 2A and 2B show schematic representations of an exemplary suspended detector illustrating some basic principles according to an aspect of the invention. A wafer-level integrated thermal detector 20 comprises a first wafer W1 and a second wafer W2 bonded together. The first wafer W1 may include a substrate 100, a wafer-wide or patterned local dielectric sacrificial layer 102 deposited on the dielectric or semiconducting substrate 100, a dielectric or semiconducting support layer 104 deposited on the dielectric sacrificial layer 102 or on the substrate 100 around a patterned local dielectric sacrificial layer 102, a suspended active thermal element 108 provided within an opening or recess 106 in the support layer 104. As schematically illustrated in FIG. 2A, the suspended thermal element 108 may initially lie on top of a wafer-wide or patterned local sacrificial layer 102 which supports and protects the suspended thermal element 108 during fabrication process. The second wafer W2 may comprise a back reflector 112 arranged to reflect light back to the suspended thermal element 108.

In embodiments of the invention, at least one of the wafers W1 and W2 may comprise a prefabricated intermediate product.

According to embodiments of the invention, the wafer W1 may comprise an intermediate product prefabricated to include at least a dielectric or semiconducting substrate 100, a dielectric sacrificial layer 102 deposited at least locally on the substrate 100, and a suspended active thermal element 108 on the dielectric sacrificial layer, and preferably also a dielectric or semiconducting support layer 104.

In embodiments of the invention, the wafer W1 may comprise an intermediate product prefabricated to further include suitable front optics 120 for entrance of radiation from outside to the suspended active thermal element 108.

In embodiments of the invention, the wafer W2 may comprise an intermediate product prefabricated to include at least a back reflector 112.

As schematically illustrated in FIG. 2B, the sacrificial layer 102 may be designed to be removed at the location of the suspended active element 108 to release the active element 108 before the complete wafer-level fabrication process ends. A first vacuum-sealed cavity 110 is provided to extend in the sacrificial layer 102, preferably being entirely or at least partly defined in a removed portion of the sacrificial layer 102, at the location of the suspended active element 108. A second vacuum-sealed cavity may be provided on the opposite back side of the suspended active thermal element 108, for example in the opening or recess of the support layer 104 that is closed by the bonded second wafer W2. The front optics 120 may be arranged to pass radiation from outside into the first vacuum-sealed cavity 110. The back reflector 112 may be arranged to reflect light back into the second vacuum-sealed cavity 106.

Moreover, electrical connection means 114 may be provided to connect the suspended active element 108 to an external circuit, such as Read Out Integrated Circuit (ROIC) or another type of readout means. In the example illustrated in FIGS. 2A and 2B the detector chip 20 is mounted on top of and connected to a ROIC.

Figure 3A:
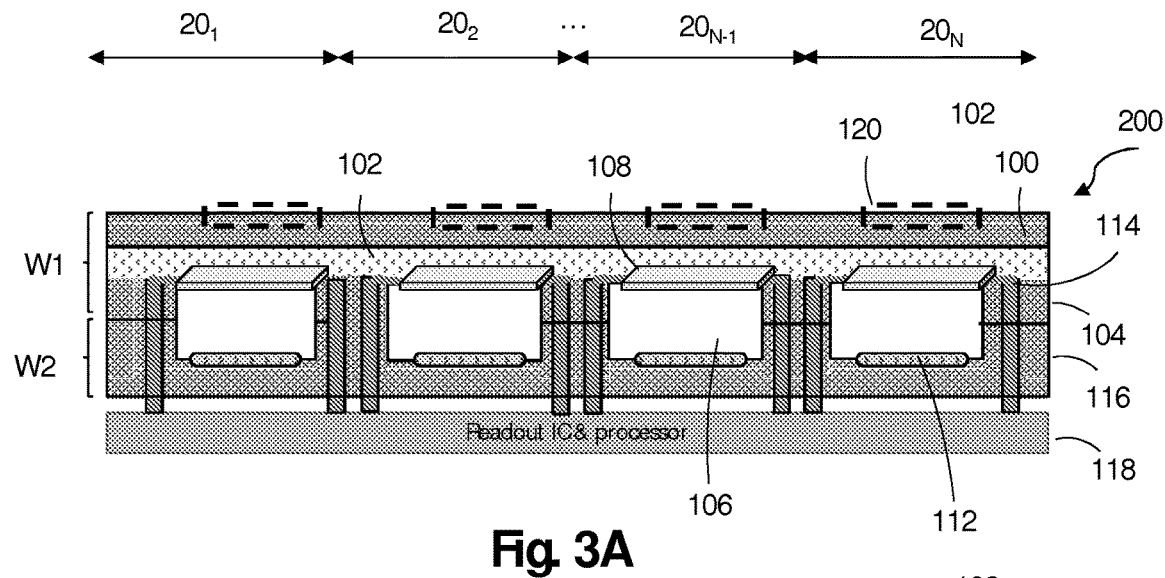
FIGS. 3A, 3B and 3C show schematic representations of exemplary suspended detector arrays according to an aspect of the invention.
Figure 3B:
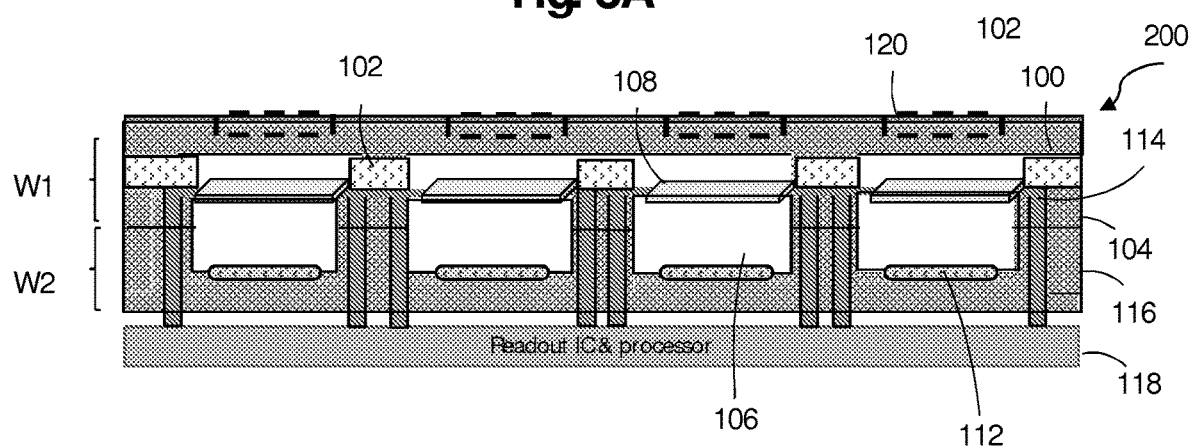
Figure 3C:
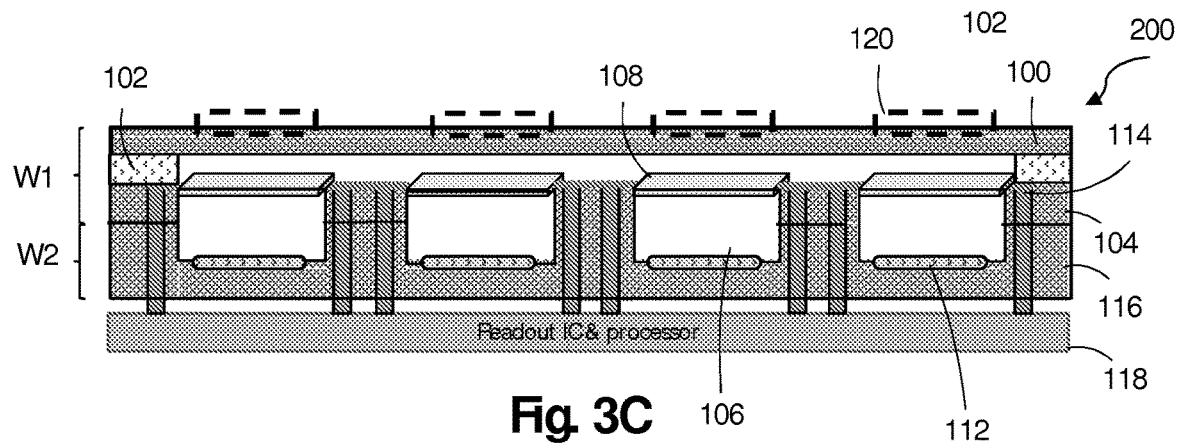

FIGS. 3A, 3B and 3C show schematic representations of exemplary suspended detector array illustrating some basic principles according to an aspect of the invention. The detector array may be considered to comprise a plurality of thermal detectors, such as detectors according the aspect of the invention illustrated in FIGS. 2A and 2B. Accordingly, a wafer-level integrated thermal detector array chip 200 may comprise a first wafer W1 and a second wafer W2 bonded together. The array 200 may be a one-dimensional or two-dimensional M×N array, wherein M and N are positive integers. The first wafer W1 may include a dielectric or semiconducting substrate 100, a wafer-wide or patterned local dielectric sacrificial layer 102 deposited on the substrate 100, a dielectric or semiconducting support layer 104 deposited on the dielectric sacrificial layer 102 or on the substrate 100, an M×N array of suspended active thermal elements 108 provided within a corresponding M×N array of openings or recesses 106 in the support layer 104. The second wafer W2 may comprise a back reflector 112 arranged to reflect light back to the suspended thermal element 108.

In embodiments of the invention, at least one of the wafers W1 and W2 may comprise a prefabricated intermediate product.

According to embodiments of the invention, the wafer W1 may comprise an intermediate product prefabricated to include at least a dielectric or semiconducting substrate 100, a wafer-wide or patterned local dielectric sacrificial layer 102 deposited on the substrate 100, and an M×N array of suspended active thermal elements 108 on the dielectric sacrificial layer, and preferably also a dielectric or semiconducting support layer 104.

In embodiments of the invention, the wafer W1 may comprise an intermediate product prefabricated to further include suitable front optics 120 for entrance of radiation from outside to the suspended active thermal element 108.

In embodiments of the invention, the wafer W2 may comprise an intermediate product prefabricated to further include a one-dimensional or two-dimensional M×N array of back reflector 112.

As schematically illustrated in FIG. 3A, each suspended thermal element 108 may initially lie on top of wafer-wide or patterned local sacrificial layer 102 which supports and protects the suspended thermal elements 108 during fabrication process. The sacrificial layer 102 may be arranged to be removed at the locations of the M×N suspended active elements 108 to release the active elements 108 before the complete wafer-level fabrication process ends, as schematically illustrated in FIG. 3B. A first vacuum-sealed cavity 110 may also be provided to extend in the sacrificial layer 102, preferably being entirely or at least partly defined in a removed portion of the sacrificial layer 102 at the location of each suspended active element 108. Thereby a one-dimensional or two-dimensional M×N array of first vacuum-sealed cavities 110 may be provided that are separated from each other by the intermediate remaining portions of the sacrificial layer 102, as illustrated in FIG. 3B, or by the support layer 104 deposited on the substrate. Alternatively, the sacrificial layer 102 may be arranged to be removed over the entire array of the suspended active elements 108 so that the vacuum-sealed cavities 110 are not separated from each other but connected to each other to form one wide vacuum-sealed cavity 210, as illustrated in FIG. 3C. A second vacuum-sealed cavity may be provided on the opposite side of each suspended active thermal element 108, for example in the opening or recess 106 of the support layer 104 closed by the bonded second wafer W2. Thereby a one-dimensional or two-dimensional M×N array of second vacuum-sealed cavities 106 is provided. The first wafer W1 may also be provided with suitable front optics 120 for entrance of radiation from outside into each first vacuum-sealed cavity 110. A one-dimensional or two-dimensional M×N array of back reflector 112 may be arranged to reflect light back into each second vacuum-sealed cavity 106.

Moreover, electrical connection means 114 may be provided to connect each suspended active element 108 separately to an external circuit, such Read Out Integrated Circuit (ROIC) or another type of readout means. In the examples illustrated in FIGS. 3A, 3B and 3C the detector array chip 200 is mounted on top of and connected to a ROIC.

Examples of front optics 120 that may be provided in thermal detectors or thermal detector arrays according to any aspect of the invention are schematically illustrated in FIGS. 4A, 4B, 4C, 4D, 4E, and 4F. It should be appreciated that these schematic presentations may not show various optional, alternative, and preferred features and details that may be present in various implementations of front optics. In each example, front optics for an array of two thermal detectors are illustrated, but similar front optics may be applied to any thermal detector array or individual thermal detector according to any aspect and embodiment of the invention.

Figure 4A:
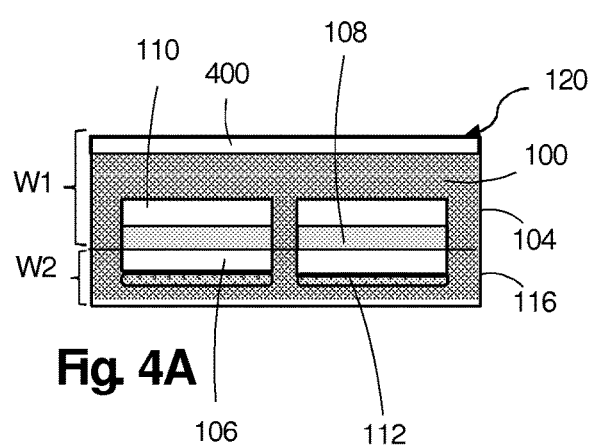
FIGS. 4A, 4B, 4C, 4D, 4E, and 4F show examples of front optics that may be provided in thermal detectors or thermal detector arrays according to aspects of the invention.
Figure 4B:
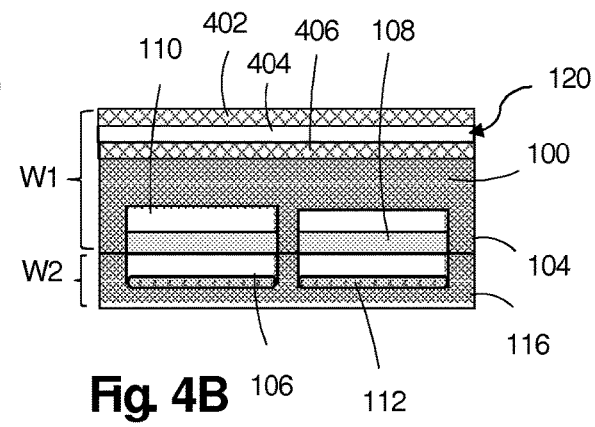

In embodiments front optics 120 may comprise an anti-reflection coating on the front surface of the wafer W1 to reduce reflection. In FIG. 4A, an exemplary anti-reflection coating with a single film 400 is shown. In FIG. 4B, an exemplary anti-reflection coating with a stack of films or layers 402, 404 and 406 is shown. The stack may comprises alternating layers of contrasting refractive index (a low-index material and a higher-index material), so that the stack of dielectric films or layers may form a distributed Bragg reflector, DBR. The thickness of each film or layer may preferably be a quarter of a target wavelength $\lambda$. Examples of suitable materials for IR wavelengths include Si, Ge, CdTe, ZnSe, and ZnS. The anti-reflection coating may be deposited on the front surface of the wafer W1 in a suitable phase during a prefabrication or fabrication process.

Figure 4C:
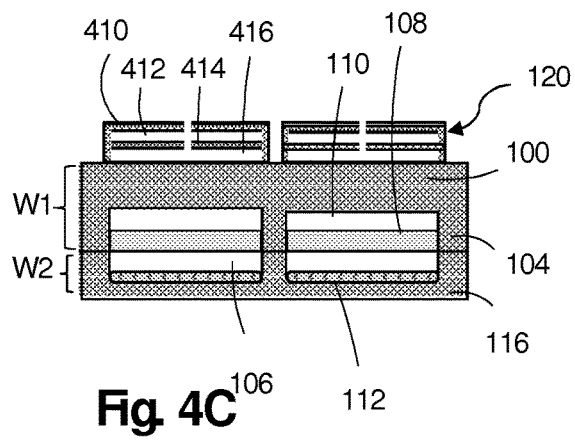

In embodiments front optics 120 may comprise an anti-reflection structure on the front surface of the wafer W1 to reduce reflection. An example of an anti-reflection structure is a poly-air distributed Bragg reflector having multi-layer structure of alternating poly-Si layers 410, 414 and air-gaps 412, 416, as schematically shown in FIG. 4C.

Figure 4D:
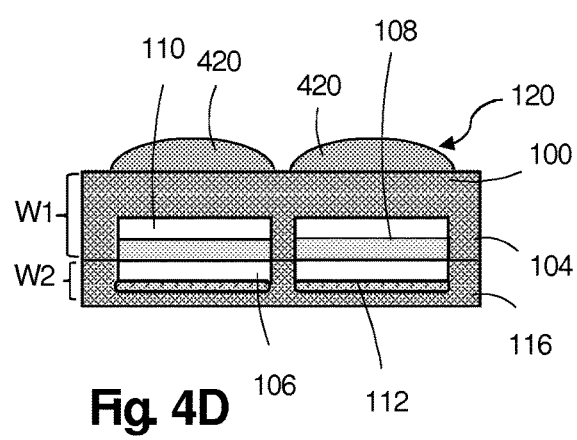

In embodiments front optics 120 may comprise at least one microlens 420 arranged to focus and concentrate radiation onto the suspended active element 108, as schematically illustrated in FIG. 4D. There may be single-element lenses or microlens arrays (also referred to as microlenticular arrays or lenslet arrays). Microlens arrays contain multiple lenses formed in a one-dimensional or two-dimensional array. The microlenses may be grown or placed on the front surface of the wafer W1 in a suitable phase during a prefabrication or fabrication process.

In embodiments front optics 120 may comprise at least one grating, e.g. a pattern of grooves or other embossing, provided on the front surface of the wafer W1 in a suitable phase during a prefabrication or fabrication process.

Figure 4E:
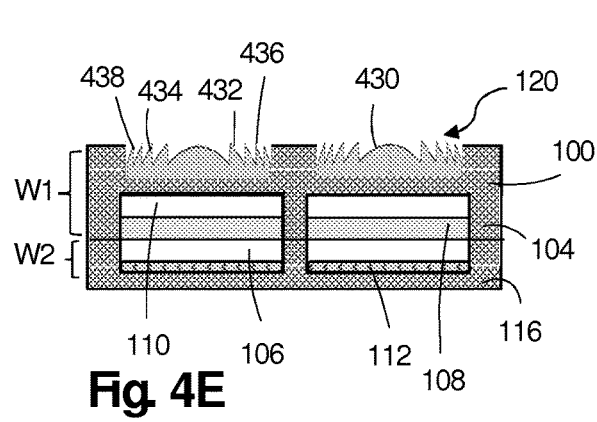

In embodiments front optics 120 may comprise at least one Fresnel microlens arranged to focus and concentrate radiation onto the suspended active element 108, as schematically illustrated in FIG. 4E. A Fresnel microlens may be constructed of many divided annular zones 30, 32, 34, 36 and 38 with smooth contours in each zone. The Fresnel microlens may be implemented by means of a grating (e.g. a pattern of grooves or other embossing), a prefabricated single-element lens or a microlens array provided on the front surface of the wafer W1 in a suitable phase during a prefabrication or fabrication process.

Figure 4F:
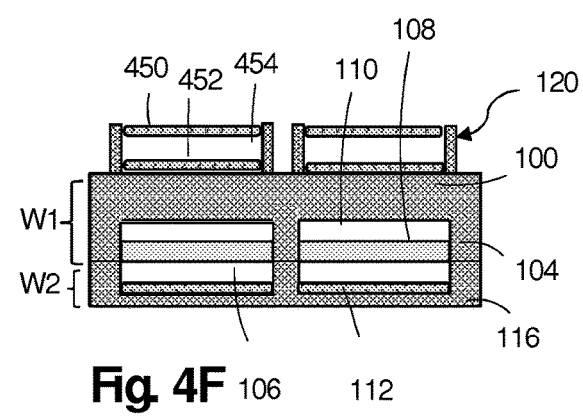

In embodiments front optics 120 may comprise at least one Fabry-Perot interferometer, as schematically illustrated in FIG. 4F. A Fabry-Perot interferometer (FPI) is a band-pass filter for electromagnetic radiation at optical frequencies, and produces a narrow pass band, known as the transmission peak. The operation is based on the optical interference between two facing parallel, often planar, reflectors (mirrors) 450 and 452 in an intermediate cavity 454 that forms an optical one-dimensional resonator. The exit signal, i.e. transmission signal, leaks out at the resonance wavelength, i.e. at a transmission wavelength, and the spectrum of the transmission peak propagates in the initial direction of the incident signal. For the incident signal to couple and the transmission signal to exit, the reflectors (mirrors) may be semi-transparent reflectors that do not feature 100% reflectivity but also have a finite transmission. The primary design factor for the transmission peak or the transmission wavelength is the spacing or gap between the facing reflectors. In embodiments, front optics with a tunable Fabry-Perot interferometer is provided wherein one of the parallel reflectors or mirrors is movable to tune the spectral location of the transmission peak.

FIGS. 5A, 5B, 5C and 5D schematically illustrate examples of ways to provide electrical connection 114 from a suspended active thermal element 108 in the wafer W1 to an external circuit, such Read Out Integrated Circuit (ROIC) or another type of readout means.

In embodiments, the support layer 104 may be made of conductive or semiconductive material, such as metal or polycrystalline silicon, also called polysilicon or poly-Si. Thus, electrical connection 114 in the wafer W1 can be made by the support layer 104, without need for a separate wiring. The support layer 104 of the wafer W1 may then be connected to electrical connections on the wafer W2, or on an external circuit, such as ROIC.

Figure 5A:
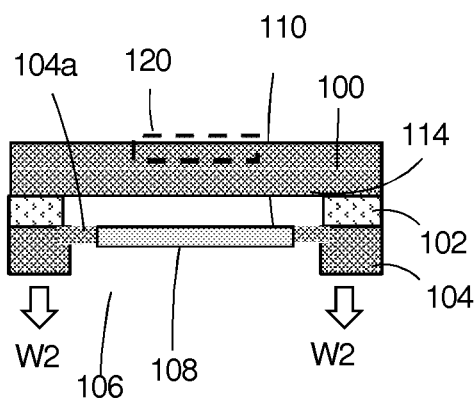
FIGS. 5A, 5B, 5C and 5D show examples of implementing an electrical connection to a suspended active thermal element in a wafer W1.

In FIG. 5A, a wafer W1 may comprise front optics 120, such as an anti-reflection layer, a dielectric or semiconducting substrate 100, a wafer-wide or patterned local dielectric sacrificial layer 102 deposited on the substrate 100, and a dielectric or semiconductive support layer 104 deposited on the dielectric sacrificial layer 102 or on the substrate 100, a suspended active thermal element 108 provided within an opening or recess 106 in the support layer 104. The support layer 104 may be made of electrically conductive or semiconducting material, such as poly-Si. The support layer 104 may further comprises a thinner shoulder portion 104a on a periphery of the opening or recess 106 for mechanical and electrical connection of the suspended active element 108. Thus, the shoulder portion 104a and the support layer 104 will provide the electrical connection 114 from the suspended active thermal element 108 to the wafer W2, particularly when the wafers W1 and W2 are fusion-activated wafer bonded or plasma-activated wafer bonded. In embodiments, the thinner shoulder portion 104a may preferably be offset from a the inner surface of the first wafer W1, more preferably the support layer 104 may be deposited on the sacrificial layer 102 at the bottom of the opening 106. The use of the offset thinner shoulder portion 104a allows a mechanical and electrical connection of the suspended element 108 to the support layer 104 without compromising the smoothness of the inner side of the wafer W1, and thereby the quality of a wafer bonding to the wafer W2.

Figure 5B:
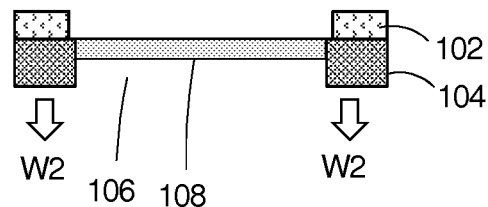

In FIG. 5B, the suspended active thermal element 108 may have an outer diameter equal to the diameter of the opening or recess 106, so that the suspended active thermal element 108 may be directly connected to the support layer 104. The support layer 104 may be made of electrically conductive or semiconducting material, such poly-Si. Thus, the support layer 104 will provide the electrical connection 114 from the suspended active thermal element 108 to the wafer W2, particularly when the wafers W1 and W2 are fusion-activated wafer bonded or plasma-activated wafer bonded.

Figure 5C:
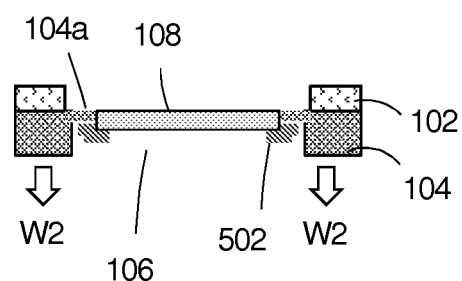

FIG. 5C illustrates a wafer W1 similar to that shown in FIG. 5A, except for a further conductive layer or wiring 502 that is arranged to extend from the inner surface of the thinner shoulder portion 104a to the inner surface of the suspended active thermal element 108. The conductive layer or wiring 502 may be made of any conductive material, such as metal or other conductive material, e.g. poly-Si. The mechanical and electrical connection of the suspended element 108 to the support layer 104 can be made without depositing conductive material on the inner surface of the opening 106 or the inner side of the wafer W1. Thus, the smoothness of the inner side of the wafer W1, and thereby the quality of a wafer bonding to the wafer W2 are not compromised.

Figure 5D:
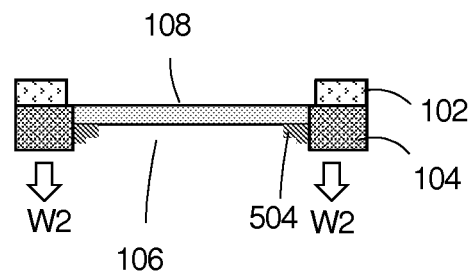

FIG. 5D illustrates a wafer W1 similar to that shown in FIG. 5B, except that a further conductive layer or wiring is arranged to extend from the inner surface of opening or recess 106 to the inner surface of the suspended active thermal element 108. The conductive layer or wiring may be made of any conductive material, such as metal or other conductive or semiconductive material, e.g. poly-Si. The mechanical and electrical connection of the suspended element 108 to the support layer 104 can be made without depositing material on the inner side of the wafer W1. Thus, the smoothness of the inner side of the wafer W1, and thereby the quality of a wafer bonding to the wafer W2 are not compromised. However, as compared with the embodiment illustrated in FIG. 5, it is more challenging to control the conductive layer deposition so that the inner surface of the wafer W1 is not affected.

In embodiments of the invention the first wafer W1 and the second wafer W2 may be wafer bonded using a fusion-activated bonding or a plasma-activated bonding or a thermocompression bonding or another type of metal-based bonding.

In embodiments of the inventions, electrical connection means 114 may be connected to an integrated readout circuit ROIC 118, preferably on a third wafer, preferably by a thermocompression bonding or another type of metal-based bonding or a chip bonding.

Figure 6A:
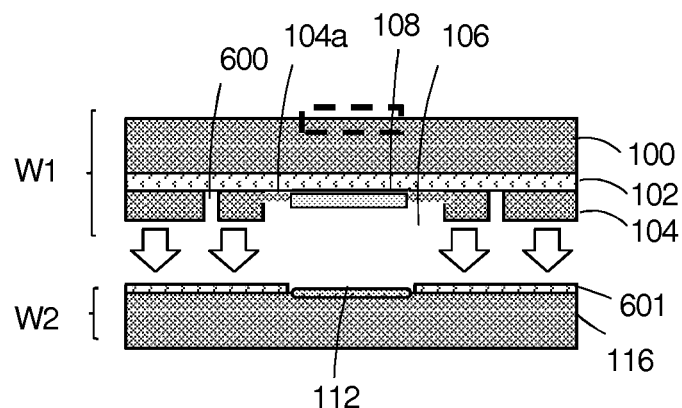
FIGS. 6A, 6B and 6C show schematic representations of providing an exemplary suspended detector 20 according to an aspect of the invention using fusion-activated wafer bonding or plasma-activated wafer bonding.
Figure 6B:
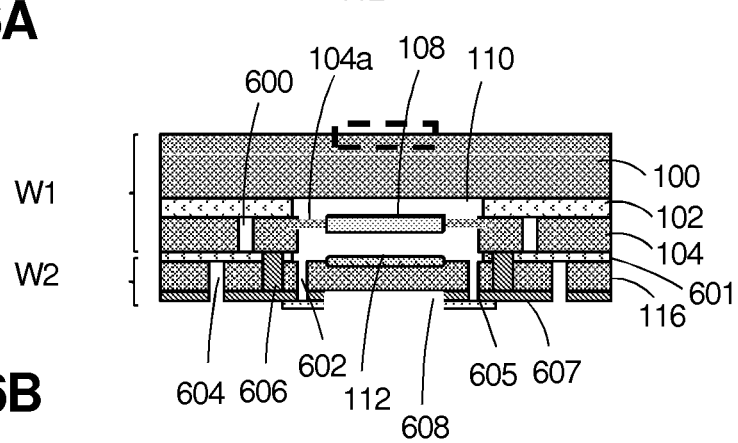
Figure 6C:
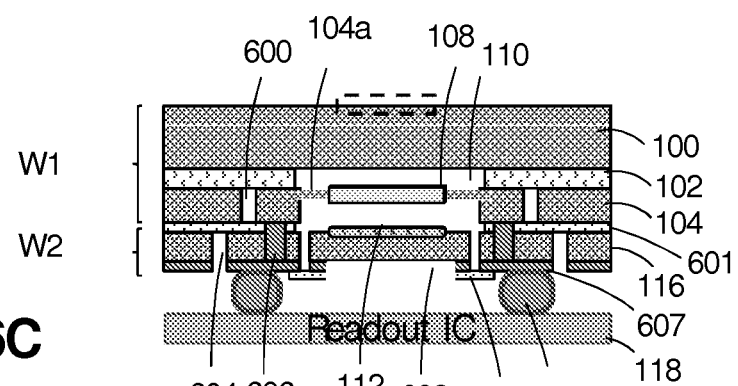

FIGS. 6A, 6B and 6C show schematic representations of providing an exemplary suspended detector 20 according to an aspect of the invention using fusion-activated wafer bonding or plasma-activated wafer bonding.

In FIG. 6A, a first wafer W1 and a second wafer W2 are attached and bonded together. The first wafer W1 includes a dielectric or semiconducting substrate 100, a wafer-wide or local patterned dielectric sacrificial layer 102 deposited on the inner side of the substrate 100, a dielectric or semiconducting support layer 104 deposited on the inner side of the dielectric sacrificial layer 102 or on the substrate 100, a suspended active thermal element 108 provided within an opening or recess 106 in the support layer 104. As schematically illustrated in FIG. 6A, the suspended thermal element 108 may initially lie on top of wafer-wide or patterned local sacrificial layer 102 which supports and protects the suspended thermal element 108 during fabrication process. The second wafer W2 may include a dielectric or semiconducting substrate 116, a back reflector 112 provided on the inner side of the substrate 116. Optionally a dielectric sacrificial layer 601 on the inner side of the substrate 116 except at the location of the back reflector 112. The sacrificial layer 601 may be employed to facilitate or improve the following fusion process, and/or to provide an electrical insulation between the wafers W1 and W2. Alternatively, a corresponding sacrificial layer may be provided on the inner side of the support layer 104 on wafer W1 instead of or in addition to the sacrificial layer 601 on the wafer W2.

In embodiments of the invention, the support layer 104 further comprises a thinner shoulder portion 104a on a periphery of the opening or recess 106 for mechanical and optionally electrical connection of the suspended active element 108. The thinner shoulder portion 104a may preferably be offset from a the inner surface of the first wafer W1, more preferably the thinner shoulder portion 104a may be deposited on the sacrificial layer 102 at the bottom of the opening 106.

In embodiments of the invention, the support layer 104 may be made of an electrically conducting or semiconducting material, so that the support layer 104, including the thinner shoulder portion 104a, may provide both mechanical and electrical connection to the suspended element 108, without need for a separate wiring. In embodiments of the inventions a trench or trenches 600 may be etched or left in the support layer 104 to provide an electrically isolated local region of the support layer 104 around the suspended element 108.

The wafers W1 and W2 may then be bonded together using fusion or plasma-activated wafer bonding, as illustrated by arrows in FIG. 6A. In the illustrated example, the inner sides or surfaces of the wafers W1 and W2 are bonded together to form a detector chip 20 as shown in FIG. 4B. The inner surface of the support layer 104 may be bonded to the inner surface of the sacrificial layer 601.

The sacrificial layer 102 may be removed at least at the location of the suspended active element 108 to release the active element 108 before the complete wafer-level fabrication process ends, for example before the depositing a vacuum sealing layer 605 described further below. The vacuum cavities 110 and 106 may have a fluid communication through or bypass the suspended active element 108. Thereby the sacrificial layer 102 can be etched from the back side of the detector chip, and the release of the active element 108 and the forming of the vacuum sealed cavities 106, 110 can be made with one process. Release holes may be etched to the backside of the wafer W2 for release etching of the active element 108.

In embodiments of the invention, the electrical connections 114 may comprise through substrate vias (TSVs) 606 that may be etched to extend from the outer surface of the substrate 116 to the inner surface of the sacrificial layer 601. The through substrate via 605 may preferably have a substantially constant diameter through a length of the through substrate via. A diameter of the TSV must be small when high resolution is needed. A ratio of a diameter to a length of the TSV is preferably about 1:10 which means that also the substrate 116 must be very thin. The handling of the wafer W2 may require that the substrate 116 is thicker before wafer bonding, and a thinning of the substrate 116 is carried out after the wafer bonding to obtain a small thickness required for small pixel (high resolution) applications.

In embodiments, the TSVs 606 may be filled, e.g. deposited, with an electrically conducting material to provide an electrical connection to the electrically conductive support layer 104, or to an electrical wiring provided in the support layer 104. Further, an electrically conducting layer 607 may be deposited on the outer or back side of the wafer W2. Further, a vacuum sealing layer 605 may be deposited on the outer or back side of the wafer W2, for example on the electrically conducting layer 607. The vacuum sealing layer 605 may be deposited locally to seal the release holes, for example.

In embodiments of the invention, a trench 604 may be etched in the wafer W2 from the back side to the sacrificial layer 601 to provide an electrical isolation of the connection regions, such as TSVs 606, of the wafer W2, from the rest of the wafer W2.

In embodiments of the invention, a trench 602 may be etched in the wafer W2 from the back side or the vacuum sealing layer 105 to the vacuum-sealed cavity 106 to provide an electrical isolation of the connection regions, such as TSVs, of the wafer W2 from each other, and/or from the section of the substrate 116 supporting the back reflector 112.

In embodiments of the invention, a trench 608 may be provided, e.g. etched, in the electrically conducting layer 406 and optionally in the vacuum sealing layer 607 to provide an electrical isolation of the connection regions, such as TSVs 606, of the wafer W2 from each other.

In embodiments of the invention the detector chip 20 may be flip-chip bonded to an integrated readout circuit ROIC 118. In the example of FIG. 6C, flip-chip bond bumps 610 with a seed layer are provided between the connection regions 606, 607 of the wafer W2 and the ROIC 118.

Figure 7:
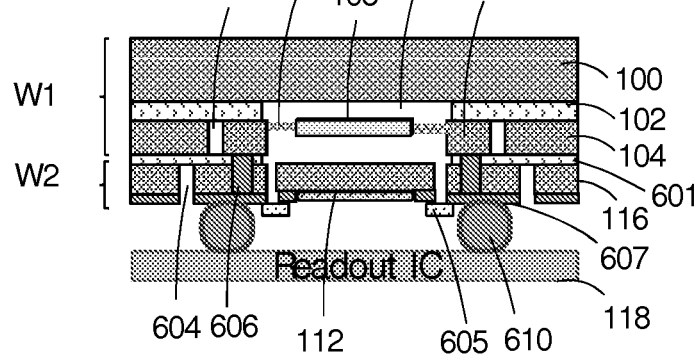
FIG. 7 shows a schematic representations of providing an exemplary suspended detector with the back reflector 112 situated on the backside of the wafer W2.

In embodiments, the back reflector 112 may be situated on the backside of the wafer W2, for example as illustrated in FIG. 7. Apart from the placement of the back reflector 112, the suspended detectors 20 FIGS. 6C and 7 may be similar to each other in structure.

In the examples illustrated herein, the back reflector 112 are illustrated as back mirror. However, it should be appreciated that the back reflector 112 may implemented in various different structures. Examples of back reflector may include one or more of: a back mirror, a metal back mirror, a Distributed Bragg reflector, a controllable moving back mirror, a Fabry-Perot interferometer, a tuneable Fabry-Perot interferometer.

A back mirror may be made of multiple materials or combinations thereof. For example, a back mirror may be a metal back mirror. For example, the metal mirror may be made of titanium nitride TiN, aluminium Al, silver Ag, wolfram W, titanium Ti, titanium tungsten TiW, or molybdium Mo The metal mirror may be protected by a protection layer, such as aluminium oxide $Al_2O_3$, silicon oxide $SiO_2$, or silicon nitrate $SiN_x$. Back mirror can also be made of heavily doped semiconducting material such as single-crystalline or polycrystalline Si.

Figure 8A:
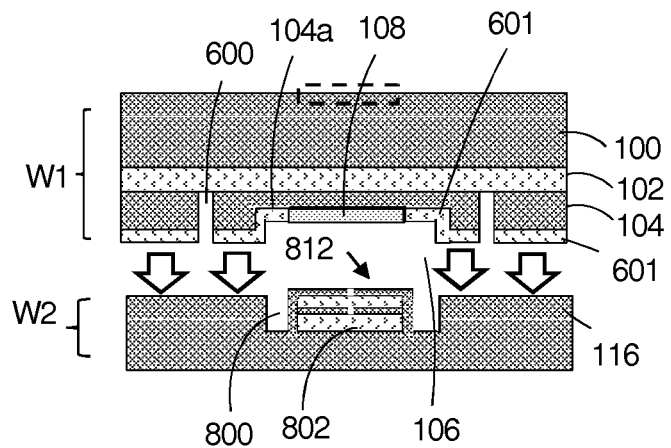
FIGS. 8A, 8B and 8C shows a schematic representation of an exemplary suspended detector wherein the back reflector is implemented as a Distributed Bragg reflector, DBR.
Figure 8B:
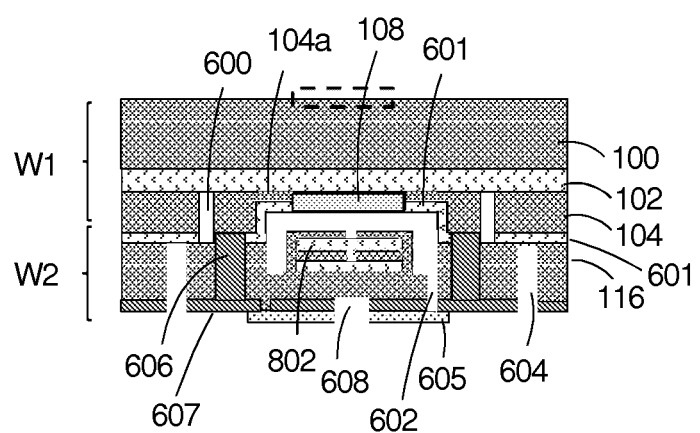
Figure 8C:
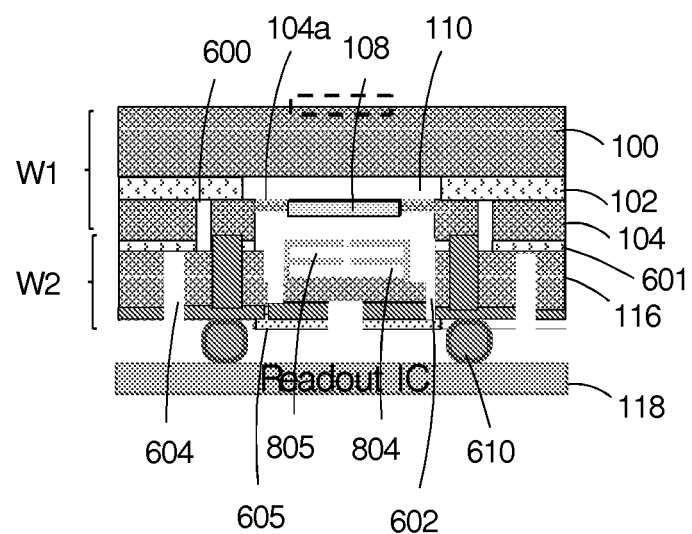

FIGS. 8A, 8B and 8C shows a schematic representation of an exemplary suspended detector illustrating some basic principles according to an aspect of the invention wherein the back reflector 812 is implemented as a Distributed Bragg reflector, DBR.

The wafer W1 illustrated FIGS. 8A, 8B and 8C may be similar to the wafer W1 illustrated FIGS. 6A, 6B and 6C. In the example of FIGS. 8A-C, a dielectric sacrificial layer 601 may be deposited on the inner side of the support layer 104 on wafer W1 instead of the inner side of the substrate 116. The dielectric sacrificial layer 601 may initially also extend along the inner surface of the opening or recession 106 to the suspended thermal element 108.

Apart from the different type of the back reflector, the wafer W2 illustrated in FIGS. 8A, 8B and 8C may be similar to the wafer W2 illustrated FIGS. 6A, 6B and 6C. The DBR back reflector 812 may be provided in a recession 800 in the substrate so that a sufficient space is assured for the vacuum-sealed chamber 106 when the wafers W1 and W2 are bonded together.

The distributed Bragg reflector, DBR 812 may comprise a stack of alternating layers of contrasting refractive index (a low-index material and a higher-index material). The thickness of each film or layer may preferably be a quarter of a target wavelength λ. Examples of suitable materials for IR wavelengths include Si, Ge, CdTe, ZnSe, and ZnS. The DBR 812 may be deposited on the inner surface the wafer W2 in a suitable phase during a prefabrication or fabrication process.

In the exemplary embodiment illustrated in FIGS. 8A-8C the back reflector may be a poly-air distributed Bragg reflector 812 having multilayer structure of alternating poly-Si layers 805 and air-gaps 804. Initially the DBR 812 may comprise alternating poly-Si layers 805 and sacrificial layers 802 as illustrated in FIGS. 8A and 8B. The sacrificial layers 802 support and protect the Bragg reflector structure during fabrication process. The sacrificial layers 802 are removed to release the poly-air distributed Bragg reflector 812 before the complete wafer-level fabrication process ends, for example before the depositing a vacuum sealing layer 605. The vacuum cavities 110 and 106 may have a fluid communication through or bypass the suspended active element 108. Thereby the sacrificial layer 102 can be etched from the back side of the detector chip, and the release of the active element 108 and the poly-air distributed Bragg reflector 812, as well as the forming of the vacuum sealed cavities 106, 110, can be made with one process. Also the portion of the sacrificial layer 601 extending to the vacuum-sealed chamber 106, if any, may be removed at the same time. Release holes may be etched to the backside of the wafer W2 for release etching of the active element 108 and the DBR 812.

In embodiments of the invention, the electrical connection 114 may comprise through substrate vias (TSVs) 606 that may be etched to extend from the outer surface of the substrate 116 to the inner surface of the support layer 104. In embodiments, the TSVs 606 may be filled, e.g. deposited, with an electrically conducting material to provide an electrical connection to the electrically conductive support layer 104, or to an electrical wiring provided in the support layer 104. Further, an electrically conducting layer 607 may be deposited on the outer or back side of the wafer W2. Further, a vacuum sealing layer 605 may be deposited on the outer or back side of the wafer W2, such on the electrically conducting layer 607. The vacuum sealing layer 605 may be deposited locally to seal the release holes, for example. On or more trenches 602, 604 and 608 may be etched in the wafer W2 from the back side to provide an electrical isolation of the connection regions, such as TSVs 606, of the wafer W2, from the rest of the wafer W2, from each other, and/or from the back reflector structure 812. The detector chip 20 may be flip-chip bonded to an integrated readout circuit ROIC 118. In the example of FIG. 8OC, flip-chip bond bumps 610 with a seed layer are shown between the connection regions 606, 607 of the wafer W2 and the ROIC 118.

Figure 9A:
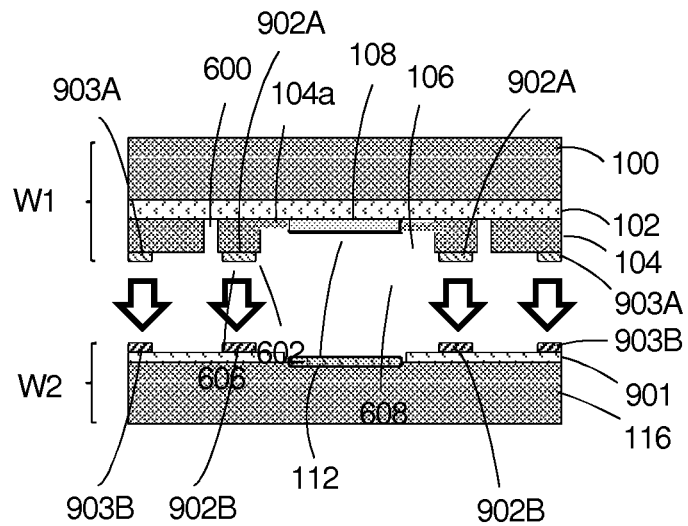
FIGS. 9A, 9B and 9C show schematic representations of providing an exemplary suspended detector 20 according to an aspect of the invention using thermocompression wafer bonding.
Figure 9B:
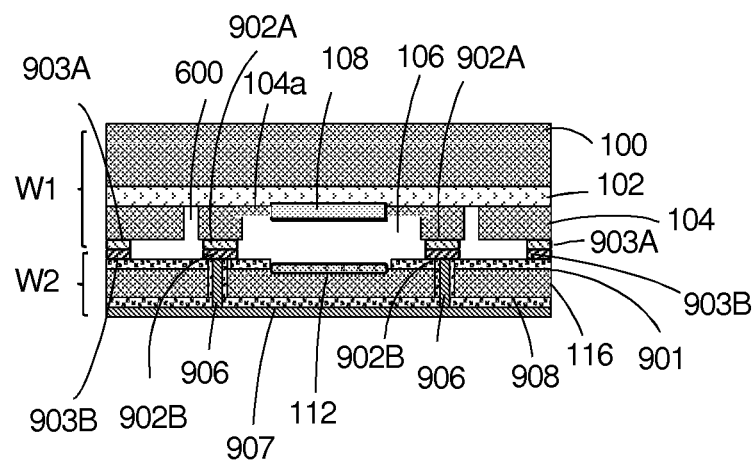
Figure 9C:
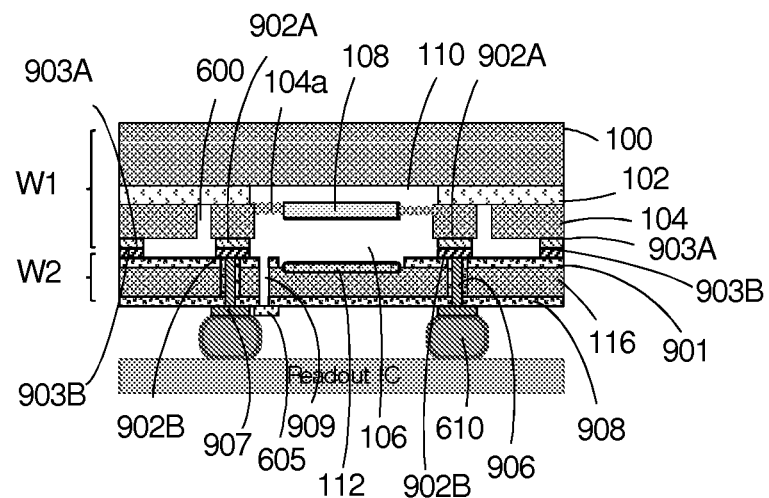

FIGS. 9A, 9B and 9C show schematic representations of providing an exemplary suspended detector 20 according to an aspect of the invention using thermocompression bonding or another type of metal-based wafer bonding. Thermocompression bonding is a wafer bonding technique in which two specific materials, typically metals, on the surfaces of the wafers to be bonded are brought into atomic contact applying force and heat simultaneously. The diffusion requires atomic contact between the surfaces due to the atomic motion. The atoms migrate from one crystal lattice to the other one based on crystal lattice vibration. This atomic interaction sticks the interface together. Examples of suitable material pairs for the thermocompression bonding include gold/gold (Au/Au), copper/copper (Cu/Cu), aluminium/aluminium (Al/Al), silver/silicon (Au/Si), and copper/tin (Cu/Sn). In silver/silicon (Au/Si) bonding the silicon material may be a silicon substrate or a poly-Si substrate itself.

The first wafer W1 may include a dielectric or semiconducting substrate 100, a wafer-wide or patterned local dielectric sacrificial layer 102 deposited on the inner side of the substrate 100, a dielectric or semiconducting support layer 104 deposited on the inner side of the dielectric sacrificial layer 102 or on the substrate, a suspended active thermal element 108 provided within an opening or recession 106 in the support layer 104. As schematically illustrated in FIG. 9A, the suspended thermal element 108 may initially lie on top of the sacrificial layer 102 which supports and protects the suspended thermal element 108 during fabrication process.

The second wafer W2 may include a dielectric or semiconducting substrate 116, a back reflector 112 provided on the inner side of the substrate 116, and an insulating layer 901 (e.g. SiO$_2$) deposited on the inner side of the substrate 116. The insulating layer 901 may provide an electrical insulation between the wafers W1 and W2. Alternatively, an insulation layer may be provided on the inner side of the support layer 104 on wafer W1 instead of or in addition to the insulating layer 901 on the wafer W2. The electrical insulating may alternatively be arranged by appropriately located trenches, or a combination of trenches and insulating layers.

A patterned bonding material layer of a first bonding material may be provided on the inner surface of the wafer W1, and a corresponding patterned bonding material layer of a second bonding material may be provided on the inner surface of the wafer W1. For Example, a first plurality of bonding metal bumps or pads or leads 902A, 903A may be provided on the inner surface of the wafer W1, and a matching second plurality of bonding metal bumps or pads or leads 902B, 903B may be provided on the inner surface of the wafer W2. In the exemplary embodiment illustrated in FIGS. 9A-9C, the patterned bonding material layers are shown to be of different materials but both bonding material layer can be of the same material. Examples of suitable bonding material pairs were given above.

In embodiments of the invention, the support layer 104 further comprises a thinner shoulder portion 104a on a periphery of the opening or recession 106 for mechanical and optionally electrical connection of the suspended active element 108. The thinner shoulder portion 104a may preferably be offset from a the inner surface of the first wafer W1, more preferably the thinner shoulder portion 104a may be deposited on the sacrificial layer 102 at the bottom of the opening or recession 106.

In embodiments of the invention, the support layer 104 may be made of an electrically conducting material, so that the support layer 104, including the thinner shoulder portion 104a, may provide both mechanical and electrical connection to the suspended element 108, without need for a separate wiring. In embodiments of the inventions a trench or trenches 600 may be etched or left in the support layer 104 to provide an electrically isolated local region of the support layer 104 around the suspended element 108.

The wafers W1 and W2 may then be bonded together using thermocompression bonding or another type of metal-based wafer bonding, as illustrated by arrows in FIG. 9A. In the illustrated example, the inner sides or surfaces of the wafers W1 and W2 are bonded together to form a detector chip 20 as shown in FIG. 9B. The patterned metal bonding layer, e.g. bonding metal bumps or pads or leads 902, 903, on inner surface wafer W1 may be bonded to corresponding co-incident bonding metal bumps or pads or leads 902B, 903B the inner surface of the wafer W2.

The sacrificial layer 102 may be removed at least at the location of the suspended active element 108 to release the active element 108 before the complete wafer-level fabrication process ends, for example before the depositing a vacuum sealing layer 605. The vacuum cavities 110 and 106 may have a fluid communication through or bypass the suspended active element 108. Thereby the sacrificial layer 102 can be etched from the back side of the detector chip, and the release of the active element 108 and the forming of the vacuum sealed cavities 106, 110 can be made with one process. Release holes, such as a hole 909, may be etched to the backside of the wafer W2 for release etching of the active element 108.

In embodiments of the invention, the electrical connection 114 may comprise through substrate vias (TSVs) 906 that may be etched to extend from the outer surface of the substrate 116 to the inner surface of the insulating layer 901 to contact the bonding metal bumbs 902B.

In embodiments, an insulating coating may be deposited on the through substrate vias (TSVs) 906. In embodiments, an insulating layer 908 may be deposited on the backside of the substrate 116.

In embodiments, the through substrate vias (TSVs) 906 may be filled, e.g. deposited, with an electrically conducting material to provide an electrical connection to the patterned bonding metal layer, e.g. bonding metal bumps 902, and thereby to the electrically conductive support layer 104, or to an electrical wiring provided in the support layer 104. Further, an electrically conducting layer 907 may be deposited on the outer or back side of the wafer W2, preferably on the insulating layer 908. Further, a vacuum sealing layer 605 may be deposited on the outer or back side of the wafer W2, such on the electrically conducting layer 607. The vacuum sealing layer 605 may be deposited locally to seal the release holes, such as a release hole 909.

In embodiments of the invention the detector chip 20 may be flip-chip bonded to an integrated readout circuit ROIC 118. In the example of FIG. 9C, flip-chip bond bumps 610 with a seed layer are shown between the connection regions 906, 907 of the wafer W2 and the ROIC 118.

In embodiments, the back reflector 112 may be situated on the backside of the wafer W2 also in embodiments using thermocompression bonding or another type of metal-based wafer bonding, for example in a similar manner as illustrated in FIG. 7. Apart from the placement of the back reflector 112, such detector chip 20 may be similar to that illustrated in FIGS. 9A-9C.

In embodiments, the back reflector may be implemented by a distributed Bragg reflector also in embodiments using thermocompression bonding or another type of metal-based wafer bonding, for example in a similar manner as the distributed Bragg reflector illustrated in FIGS. 8A-8C. Apart from the different type of the back reflector, such detector chip 20 may be similar to that illustrated in FIGS. 9A-9C.

It should be appreciated that the schematic presentations may not show various optional, alternative, and preferred features and details that may be present in a detector, such as electric insulation layers, vacuum-sealing layers, protective layers, antireflective layers, bonding layers, etc.

FIG. 10 show schematic representation of a further exemplary suspended detector 20 according to an aspect of the invention using thermocompression bonding or another type of metal-based wafer bonding. This exemplary detector may be similar to that illustrated in FIG. 9C with some modifications. Front optics 120 comprising an anti-reflection coating with a single film 400 may be provided on the front surface of the wafer W1 to reduce reflection, and a further wafer-wide or patterned local anti-reflection coating 1001 may be provided between the opposite side of the substrate 100 and the vacuum cavity 110 to further reduce reflection. Further, the support layer 104 may now be in form of a conductive or semiconducting film having a thickness that is about equal to or even less than the thickness of the suspended active element 108. A vacuum chamber 1002 between the suspended active element 108 and the back reflector 108 may be defined by the patterned bonding material layer, e.g. bonding metal bumps, pads or leads 902.

FIG. 11 shows a schematic representation of exemplary suspended detector array comprising a plurality of thermal detectors (two detectors are shown in FIG. 11) according to an aspect of the invention using thermocompression bonding or another type of metal-based wafer bonding.wafer bonding. The detectors 20 of the array may be similar to that illustrated in FIG. 9C with some modifications. Front optics 120 comprising an anti-reflection coating with a single film 400 may be provided on the front surface of the wafer W1 to reduce reflection, and a further wafer-wide or patterned local anti-reflection coating 1001 may be provided between the opposite side of the substrate 100 and the vacuum cavity 110 to further reduce reflection.

FIG. 12 shows a schematic representation of exemplary suspended detector array comprising a plurality of thermal detectors (two detectors are shown in FIG. 12) according to an aspect of the invention using thermocompression bonding or another type of metal-based wafer bonding. The detectors 20 of the array may be similar to that illustrated in FIG. 10.

Figure 13A:
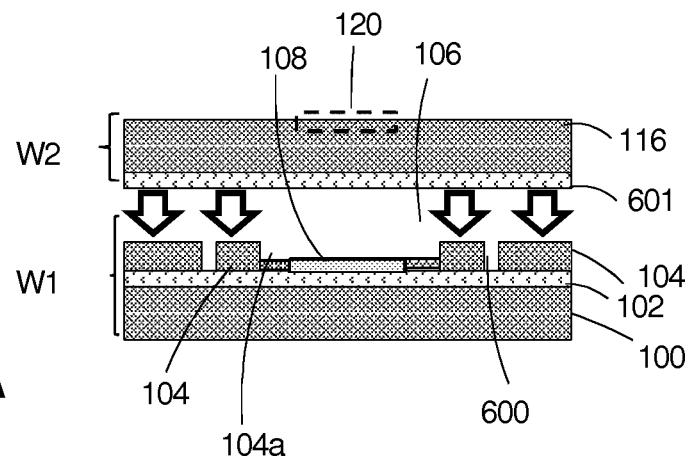
FIGS. 13A and 13B show schematic representations of providing an exemplary suspended detector 20 according to an aspect of the invention using fusion-activated wafer bonding or plasma-activated wafer bonding.
Figure 13B:
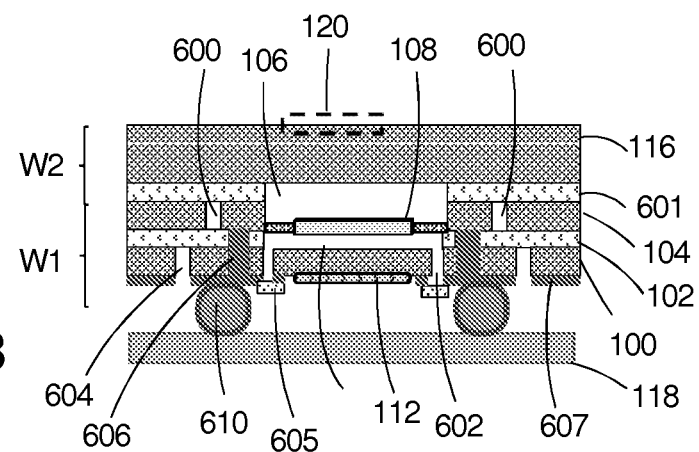

FIGS. 13A and 13B show schematic representations of providing an exemplary suspended detector 20 according to an aspect of the invention using fusion-activated wafer bonding or plasma-activated wafer bonding. A wafer-level integrated thermal detector 20 comprises a first wafer W1 and a second wafer W2 bonded together. However, in this exemplary embodiment, the second wafer W2 forms a front side of the detector through which the radiation enters the detector. The second wafer W2 may comprise a dielectric or semiconducting substrate 116, and optionally a dielectric sacrificial layer 601. The second wafer W2 may further comprise front optics 120, for example in a similar manner as the first wafer W1 in the exemplary embodiments described above. The first wafer W1 may include a dielectric or semiconducting substrate 100, a wafer-wide or patterned local dielectric sacrificial layer 102 deposited on the substrate 100, a dielectric or semiconducting support layer 104 deposited on the dielectric sacrificial layer 102 or on the substrate 100 around a patterned local dielectric sacrificial layer 102, and a suspended active thermal element 108 that may be provided within an opening or recess 106 in the support layer 104. As schematically illustrated in FIG. 13A, the suspended thermal element 108 may initially lie on top of a wafer-wide or patterned local sacrificial layer 102 which supports and protects the suspended thermal element 108 during fabrication process. The sacrificial layer 601 may be employed to facilitate or improve the following fusion process, and/or to provide an electrical insulation between the wafers W1 and W2. Alternatively, a corresponding sacrificial layer may be provided on the inner side of a support layer 104 on wafer W1 instead of or in addition to the sacrificial layer 601 on the wafer W2.

The first wafer W1 may further comprise a back reflector 112 prefabricated on the opposite or back side of the substrate 100. A back reflector 112 may also be fabricated on the opposite or back side of the substrate 100 during the manufacture of the detector. The material of the substrate 116 may be transparent to radiation. In embodiments an opening may be provided in the substrate 116 at the location of the back reflector 112 during the manufacture of the detector 20.

The wafers W1 and W2 may be bonded together using fusion or plasma-activated wafer bonding, as illustrated by arrows in FIG. 13A. In the illustrated example, the inner sides or surfaces of the wafers W1 and W2 are bonded together to form a detector chip 20 as shown in FIG. 13B. The inner surface of the sup-port layer 104 may be bonded to the inner surface of the sacrificial layer 601.

The sacrificial layer 102 may be removed at least at the location of the sus-pended active element 108 to release the active element 108 before the complete wafer-level fabrication process ends, for example before the depositing a vacuum sealing layer 605 described further below. A first vacuum-sealed cavity 110 is also provided in a removed portion of the sacrificial layer 102 at the location of the suspended active element 108. A second vacuum-sealed cavity is provided on the opposite side of the suspended active thermal element 108 the opening 106 of the support layer 104 closed by the bonded second wafer W2. The vacuum cavity 106 may be enlarged by removing a portion of the sacrificial layer 601. The vacuum cavities 110 and 106 may have a fluid communication through or bypass the suspended active element 108. Thereby the sacrificial layers 102 and 106 can be etched from the back side of the detector chip, and the release of the active element 108 and the forming of the vacuum sealed cavities 106, 110 can be made with one process. Release holes may be etched to the backside of the wafer W2 for release etching of the active element 108.

In embodiments, the electrical connections may comprise through substrate vias (TSVs) 606 that may be etched to extend from the outer surface to the inner surface of the substrate 100. The through substrate via 605 may preferably have a substantially constant diameter through a length of the through substrate via. A diameter of the TSV must be small when high resolution is needed. A ratio of a diameter to a length of the TSV is preferably about 1:10 which means that also the substrate 100 must be very thin. The handling of the wafer W2 may require that the substrate 100 is thicker before wafer bonding, and a thinning of the substrate 100 is carried out after the wafer bonding to obtain a small thickness required for small pixel (high resolution) applications.

In embodiments, the TSVs 606 may be filled, e.g. deposited, with an electrically conducting material to provide an electrical connection to the electrically conductive support layer 104, or to an electrical wiring provided in the support layer 104. Further, an electrically conducting layer 607 may be deposited on the outer or back side of the wafer W1.

Further, a vacuum sealing layer 605 may be deposited on the outer or back side of the wafer W1, for example on the electrically conducting layer 607. The vacuum sealing layer 605 may be deposited locally to seal trenches or release holes, for example.

In embodiments of the invention, a trench 604 may be etched in the wafer W1 from the back side to the sacrificial layer 102 to provide an electrical isolation of the connection regions, such as TSVs 606, of the wafer W1, from the rest of the wafer W1.

In embodiments of the invention, a trench 602 may be etched in the wafer W1 from the back side or the vacuum sealing layer 605 to the vacuum-sealed cavity 110 to provide an electrical isolation of the connection regions, such as TSVs, of the wafer W1 from each other, and/or from the section of the substrate 100 supporting the back reflector 112.

In embodiments of the invention the detector chip 20 may be flip-chip bonded to an integrated readout circuit ROIC 118. In the example of FIG. 13B, flip-chip bond bumps 610 with a seed layer are provided between the connection regions 606, 607 of the wafer W1 and the ROIC 118.

According to an aspect of the invention a Fabry-Pérot interferometer (FPI) is integrated with a thermal detector. An approach providing a Fabry-Perot interferometer in front optics 120 is discussed in connection with FIG. 4F above.

According to an aspect of the invention a movable reflector of a Fabry-Pérot interferometer (FPI) is provided in vacuum within a wafer-level integrated thermal detector chip. A movable reflector, such as a movable mirror, provided in vacuum can be moved and operated faster, which enables faster tuning of a Fabry-Pérot interferometer (FPI).

Figures 14A, 14B:
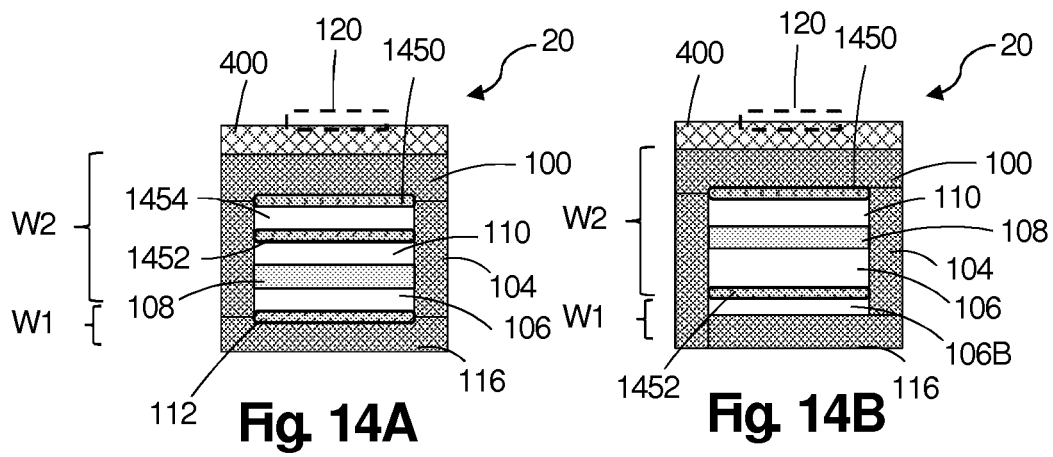
FIGS. 14A and 14B show schematic representations of exemplary wafer-level integrated thermal detectors 20 according to an aspect of the invention having a movable reflector of a Fabry-Pérot interferometer (FPI) provided in vacuum.

FIGS. 14A and 14B show schematic representations of exemplary wafer-level integrated thermal detectors 20 according to an aspect of the invention having a movable reflector of a Fabry-Pérot interferometer (FPI) provided in vacuum. A wafer-level integrated thermal detector 20 may comprise a first wafer W1 and a second wafer W2 that may be fusion-activated wafer bonded or plasma-activated wafer bonded or metalcompression bonded or otherwise metal-based wafer bonded, for example a similar manner as described above for exemplary embodiments without an FPI. It should be appreciated that the schematic presentations may not show various optional, alternative, and preferred features and details that may be present in a detector, such as electric insulation layers, vacuum-sealing layers, protective layers, antireflective layers, bonding layers, etc. Examples of such features are given in different embodiments herein. In FIGS. 14A and 14B front optics 120, specifically an antireflective layer 400 are shown.

In the example of FIG. 14A, a Fabry-Perot interferometer (FPI) comprises a fixed reflector 1450 and a movable reflector 1452 as well as an intermediate vacuum cavity or gap 1454. The movable reflector 1452 of the FPI is arranged in a vacuum cavity on a front side of the suspended active element 108 within the wafer-level integrated thermal detector 20. A vacuum cavity 110 is configured between the movable FPI reflector 1452 and the suspended active element 108 that are apart from each other. The fixed reflector 1450 of the FPI may be arranged on a front side of the movable FPI reflector 452 within the wafer-level integrated thermal detector 20, for example on an inner side of the substrate 100 of the wafer W1. The intermediate vacuum FPI cavity or gap 1454 is configured between fixed FPI reflector 1450 and the movable FPI reflector. The operation of the FPI is based on the optical interference between the reflectors (mirrors) 1450 and 1452 in an intermediate vacuum cavity 454 that forms an optical one-dimensional resonator. The incident radiation or light enters the resonator through the fixed FPI reflector 1450, and undergoes multiple reflections, and a resonance peak is created at the resonance wavelength of the resonator, and the transmission radiation or light leaks out from resonator at the resonance wavelength, i.e. at a transmission wavelength, through the movable FPI resonator 1452 to the vacuum cavity 110 and further to the suspended active element 108. For the incident signal to couple and the transmission signal to exit, the reflectors (mirrors) may be semi-transparent reflectors that do not feature 100% reflectivity but also have a finite transmission. The length L of the FPI cavity 1454, i.e. the spacing gap between the FPI mirrors 1450 and 1452, is an integral number of half wavelength $\lambda/2$, that is $L=m\lambda/2$, wherein $\lambda$=resonance wavelength and m is a positive integer. The wafer W1 may have a support structure to mechanically support the movable FPI reflector 1452 to the wafer W1, and electrical connections to connect a tuning or actuation signal to the movable FPI reflector 1452 from an external control source, such as from an integrated readout circuit ROIC. The tuning or actuation signal controls movement of the FPI reflector 1452 and the spacing gap (the length L of the cavity 1454) between the FPI reflectors 1450 and 1452, and thereby the spectral location of the transmission peak passing through to the suspended active element 108.

The suspended active element 108 may be provided in an opening or recess of a support layer 104 of the wafer W1, and it may be electrically and mechanically connected to the support layer 104. Regarding the suspended active element 108, the support 104 and the electrical and mechanical connections, the wafer W1 may be implemented, for example, substantially in a similar manner as described above for exemplary embodiments of a wafer-level integrated thermal detector 20 without an FPI. Also the movable FPI reflector 1452 may be electrically and mechanically connected to the support 104 or to a similar structure. However, the electrical connections of the suspended active element and the movable FPI reflector 1452 shall be electrically isolated from each other.

The suspended thermal element 108 may initially lie on top of a wafer-wide or patterned local sacrificial layer (not shown) deposited on the back side of the movable FPI reflector 1452, the sacrificial layer supporting and protecting the suspended thermal element 108, and also the movable FPI reflector 1452 during fabrication process. Similarly the movable FPI reflector 1452 may initially lie on top of a wafer-wide or patterned local sacrificial layer (not shown) deposited on the back side of the fixed FPI reflector 1450, the sacrificial layer supporting and protecting the movable FPI reflector 1452 during fabrication process. The sacrificial layer or layers may be removed at least at the location of the suspended active element 108 to release the active element 108, and optionally the movable FPI reflector 1452 before the complete wafer-level fabrication process ends, for example before the final vacuum sealing. The vacuum-sealed cavity 110 may be provided in place of a removed portion of the sacrificial layer between the suspended active element 108 and the movable FPI reflector 1452. Similarly the vacuum-sealed FPI cavity 1454 may be provided in place of a removed portion of the artificial layer between the movable FPI reflector 1452 and the fixed FPI reflector 1450.

The second wafer W2 may comprise a dielectric or semiconducting substrate 116 and a back reflector 112 arranged to reflect light back to the suspended thermal element 108. The second wafer W2 may be configured, for example, substantially in a similar manner as described above for exemplary embodiments of a wafer-level integrated thermal detector 20 without an FPI. Additionally there may be electrical connections to connect a tuning or actuation signal of the movable FPI reflector to the wafer W1 from an external control source, such as from an integrated readout circuit ROIC.

For example in a similar manner as described above for exemplary embodiments of the detector chip 20 without an FPI, a detector chip 20 with the FPI may be flip-chip bonded or otherwise connected to an integrated readout circuit ROIC. However, the electrical connections of the suspended active element 108 and the movable FPI reflector 1452 shall be electrically isolated from each other.

In the example of FIG. 14B, a fixed reflector 1450 of a Fabry-Pérot interferometer (FPI) may be arranged in the vacuum cavity 110 on a front side of the suspended active element 108 within the wafer-level integrated thermal detector 20, for example on an inner side of the substrate 100 of the wafer W1. A movable reflector 1452 of a Fabry-Pérot interferometer (FPI) may be arranged in a vacuum cavity 106 on a back side of the suspended active element 108 within the wafer-level integrated thermal detector 20, for example on an inner side of the wafer W2. The vacuum cavities 110 and 106 together may form a vacuum FPI resonant cavity 1054 of the FPI. It may also be said that the suspended active element 108 is arranged in a vacuum FPI resonant cavity 1054 formed within a wafer-level integrated thermal detector between the fixed FPI reflector 1450 and the movable FPI reflector 1452. In embodiments, the movable FPI reflector 1452 may also function as a back reflector 112 for the suspended active element 108, and a separate back reflector can be omitted. A further vacuum cavity 106b may be configured on the back side of the movable FPI reflector 1452, for example between the movable FPI reflector 1452 and the substrate 116 of the wafer W2.

The operation of the FPI is based on the optical interference between the reflectors (mirrors) 1450 and 1452 in an intermediate cavity 1454 (the vacuum cavities 110 and 106) that forms an optical one-dimensional resonator. The incident radiation or light enters the resonator through the fixed FPI reflector 1450, and undergoes multiple reflections, and a resonance peak of the radiation or light is created at the resonance wavelength of the resonator. The length L of the FPI cavity 1454, i.e. the spacing gap between the FPI mirrors 1450 and 1452, is an integral number of half wavelength $\lambda/2$, that is $L=m\lambda/2$, wherein $\lambda$=resonance wavelength and m is a positive integer. As the suspended active element 108 is arranged within FPI resonant cavity 1054 between the fixed FPI reflector 1450 and the movable FPI reflector 1452, the suspended active element 108 will detect the radiation or light at the resonance wavelength. The suspended active element 108 will absorb part of the radiation energy but the resonance will be maintained when the loss in the resonator cavity 1454 is smaller than the radiation energy entering the resonator cavity 1454. For the incident signal to couple to the resonator cavity 1454, the fixed FPI reflector (mirror) 1450 may be a semitransparent reflector that does not feature 100% reflectivity but also has a finite transmission. The movable FPI reflector 1452 can be a non-transparent reflector with approximately 100% reflectivity, since no transmission signal is needed and it may be preferred to minimize the energy loss in the movable FPI reflector.

Except for the fixed FPI reflector 1450, the wafer W1 may be implemented, for example, as described above for embodiments of a wafer-level integrated thermal detector 20 without an FPI. The suspended active element 108 may be provided in an opening or recess 106 of a dielectric or semiconducting support layer 104 of the wafer W1, and it may be electrically and mechanically connected to the n support 104. The suspended thermal element 108 may initially lie on top of a wafer-wide or patterned local sacrificial layer (not shown) deposited on the back side of the fixed FPI reflector 1450, the sacrificial layer supporting and protecting the suspended thermal element 108 during fabrication process. The vacuum-sealed cavity 110 may be provided in place of a removed portion of the sacrificial layer between the suspended active element 108 and the fixed FPI reflector 1450.

The second wafer W2 may comprise a dielectric or semiconducting substrate 116 and the movable FPI reflector 1452. The movable FPI reflector 1452 may be electrically and mechanically connected to a support structure (not shown) provided on the inner side of the wafer W2 so that the vacuum cavity 106b is configured on the back side of the movable FPI reflector. The movable FPI reflector 1452 may be arranged to initially lie on top of a wafer-wide or patterned local sacrificial layer (not shown) deposited on the back side of the substrate, the sacrificial layer supporting and protecting the movable FPI reflector 1452 during fabrication process. The sacrificial layer may be removed at least at the location of the movable reflector 1452 to release the movable FPI reflector 1452 before the complete wafer-level fabrication process ends, for example before the final vacuum sealing, preferably at the same time with the release of the suspended active element 108. The vacuum-sealed cavity 106b may be provided in place of a removed portion of the sacrificial layer between the movable FPI reflector 1452 and the substrate 116. The movable FPI reflector 1452 may also function as a back reflector 112 for the suspended active element 108, and a separate back reflector can be omitted. When the movable FPI reflector 1452 is regarded in place of the back reflector, the second wafer W2 may be configured, for example, substantially in a similar manner as described above for exemplary embodiments of a wafer-level integrated thermal detector 20 without an FPI. For example, the electrical connections from the suspended active element 108 to an external circuit, such as an integrated readout circuit ROIC, may be arranged in a similar manner via the wafer W2. Additionally there may be electrical connections to connect a tuning or actuation signal of the movable FPI reflector 1452 from an external control source, such as from an integrated readout circuit ROIC. The electrical connections of the suspended active element 108 and the movable FPI reflector 1452 shall be electrically isolated from each other.

In a similar manner as described above for the embodiments of the detector chip 20 without an FPI, a detector chip 20 with the FPI may be flip-chip bonded or otherwise connected to an integrated readout circuit ROIC. The electrical connections of the suspended active element 108 and the movable FPI reflector 1452 shall be electrically isolated from each other.

Figure 15:
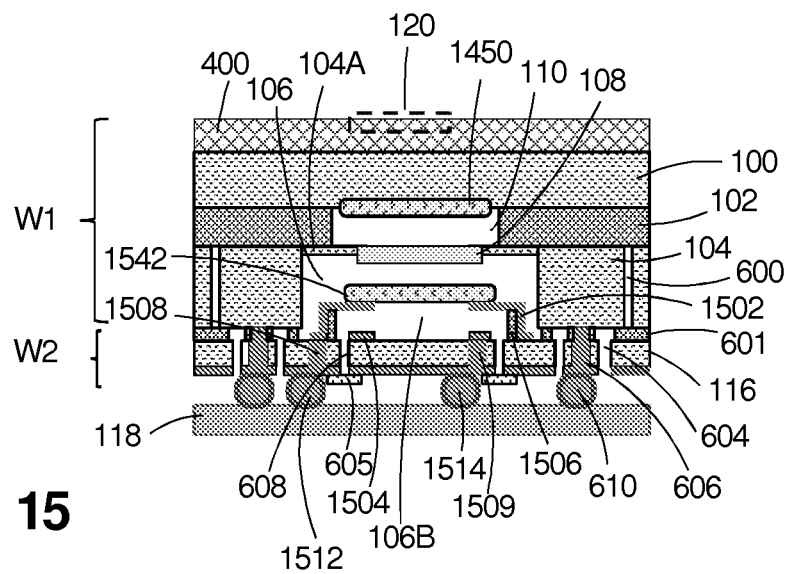
FIG. 15 shows a more-detailed schematic representation of an exemplary suspended detector 20 according to an aspect of FIG. 14B using fusion-activated wafer bonding or plasma-activated wafer bonding.

FIG. 15 show a more-detailed schematic representation of an exemplary suspended detector 20 according to an aspect of FIG. 14B using fusion-activated wafer bonding or plasma-activated wafer bonding.

In FIG. 15, a first wafer W1 and a second wafer W2 are attached and bonded together. The first wafer W1 includes a dielectric or semiconducting substrate 100, a semi-transparent fixed FPI reflector (mirror) 1450 provided on the inner side of the substrate 100, a wafer-wide or local patterned dielectric sacrificial layer 102 deposited on the inner side of the substrate 100 (and initially preferably on the inner side of the fixed FPI reflector 1450 too), a dielectric or semiconducting support layer 104 deposited on the inner side of the dielectric sacrificial layer 102 or on the substrate 100, and a suspended active thermal element 108 provided within an opening or recess 106 in the n support layer 104. The suspended thermal element 108 may initially lie on top of the wafer-wide or patterned local sacrificial layer 102 which supports and protects the suspended thermal element 108 during fabrication process. In embodiments of the invention, the support layer 104 further comprises a thinner shoulder portion 104a on a periphery of the opening or recess 106 for mechanical and optionally electrical connection of the suspended active element 108. The thinner shoulder portion 104a may preferably be offset from a the inner surface of the first wafer W1, more preferably the thinner shoulder portion 104a may be deposited on the sacrificial layer 102 at the bottom of the opening 106.

In embodiments of the invention, the support layer 104 may be made of an electrically conducting material, so that the support layer 104, including the thinner shoulder portion 104a, may provide both mechanical and electrical connection to the suspended element 108, without need for a separate wiring. In embodiments of the inventions a trench or trenches 600 may be etched or left in the support layer 104 to provide an electrically isolated local region of the support layer 104 around the suspended element 108.

The second wafer W2 may include a dielectric or semiconducting substrate 116 and a movable SPI reflector (mirror) 1452 supported on the inner side of the substrate 116. In the exemplary embodiment illustrated in FIG. 15, the movable SPI reflector 1452 may be supported by electrically-conducting connection elements 1502 projecting inwards from the inner side of the substrate 116 so that the vacuum cavity 106b is configured between the back side of the movable FPI reflector and the inner side of the substrate 116. The lower ends of the connection elements 1502 are connected to the substrate 116 and the projecting free ends are configured to support the movable FPI reflector 1452 at its peripherial area. The connection elements 1502 and/or movable FPI reflector 1452 may be arranged to initially lie on top of a patterned local sacrificial layer deposited on the back side of the substrate, the sacrificial layer supporting and protecting the connecting elements 1502 and the movable FPI reflector 1452 during fabrication process. The sacrificial layer may be removed at least at the location of the movable reflector 1452 to release the movable FPI reflector 1452 before the complete wafer-level fabrication process ends, for example before the final vacuum sealing, preferably at the same time with the release of the suspended active element 108. The vacuum-sealed cavity 106b may be provided in place of a removed portion of the sacrificial layer between the movable FPI reflector 1452 and the substrate 116. A portion of the sacrificial layer 1506 may be left under the free ends of the connection elements 1502 to strengthen the support structure. The conductive elements or layer or wiring may be made of any conductive material, such as metal or other conductive material, e.g. poly-Si. The connections elements 1502 may provide first electrodes for moving or actuation of the movable FPI reflector 1452. In embodiments, the actuation may comprise an electrostatic actuation. However, another type of actuation, such as piezo-actuation may be used instead.

In the illustrated example, further connecting layer or electrodes 1504 for electrostatic actuation may deposited on the inner side of the substrate 116. Alternatively, the substrate 116 may be used as a lower electrode for electrostatic actuation, if it is made of electrically conducting or semiconducting material, such as poly-Si. Optionally a dielectric sacrificial layer 601 may be deposited on the inner side of the substrate 116 to facilitate or improve the following fusion process, and/or to provide an electrical insulation between the wafers W1 and W2. Alternatively, a corresponding sacrificial layer may be provided on the inner side of the support layer 104 on wafer W1 instead of or in addition to the sacrificial layer 601 on the wafer W2.

The wafers W1 and W2 may be bonded together using fusion or plasma-activated wafer bonding to form a detector chip 20. The inner surface of the support layer 104 may be bonded to the inner surface of the sacrificial layer 601. The vacuum cavities 110 and 106 and optionally 106b may have a fluid communication through or bypass the suspended active element 108 and optionally the movable FPI reflector 1502. Thereby the sacrificial layer 102 and optionally the movable FPI reflector 1502 can be etched from the back side of the detector chip, and the release of the active element 108 and the forming of the vacuum sealed cavities 106, 110 and optionally 106b can be made with one process. Release holes 608 may be etched to the backside of the wafer W2 for release etching of the active element 108. Further, a vacuum sealing layer 605 may be deposited on the outer or back side of the wafer W2. The vacuum sealing layer 605 may be deposited locally to seal the release holes 608, for example.

In embodiments of the invention, the electrical connections to the suspended active element 108 may comprise through substrate vias (TSVs) 606 that may be etched to extend from the outer surface of the substrate 116 to the inner surface of the sacrificial layer 601. Similarly, through substrate vias (TSVs) 1508 and 1509 may be provided for the actuation electrodes 1502 and 1504, respectively. The dimensions of the through substrate vias may preferably be similar to those described above for embodiments without the FPI. In embodiments, the TSVs may be filled, e.g. deposited, with an electrically conducting material to provide an electrical connection to the electrically conductive support layer 104, or to an electrical wiring provided in the support layer 104, or to the electrodes 1502 and 1504. Further, an electrically conducting layer 607 may be deposited on the outer or back side of the wafer W2.

In embodiments, a trench 604 may be etched in the wafer W2 from the back side to the sacrificial layer 601 to provide an electrical isolation of the connection regions, such as TSVs 606, of the wafer W2, from the rest of the wafer W2.

In embodiments, a trench 1510 may be etched in the wafer W2 from the back side to the sacrificial layer 601 to provide an electrical isolation of the connection regions, such as TSVs 606, of the suspended active element 108, from connection regions, such as TSVs 1508 and 1509, of the actuation electrodes 1502 and 1502.

In embodiments, a trench 602 may be etched in the wafer W2 from the back side the vacuum-sealed cavity 106b to provide an electrical isolation of the connection regions, such as TSVs 1508 and 1509, of the actuation electrodes 1502 and 1502 from each other.

The detector chip 20 with the FPI may be flip-chip bonded or otherwise connected to an integrated readout circuit ROIC. In the example of FIG. 15, flip-chip bond bumps 610 with a seed layer are provided between the connection regions 606, 607 of wafer W2 and the ROIC 118 for connecting the suspended active element 108. Similarly, flip-chip bond bumps 1512 and 1514 with a seed layer are provided between the connection regions 1508 and 1509 of wafer W2 and the ROIC 118 for connecting the actuation electrodes 1502 and 1504, respectively.

In an electrostatic actuation of the movable FPI reflector 1452, an actuation potential difference may be connected between the actuation electrodes 1502 and 1504. For example, an electrostatic pull, applied through the potential difference, may attract the movable FPI reflector towards the substrate 116 and away from the fixed FPI reflector 1502. The FPI gap increases and the spectral location of the resonance peak is shifted towards longer wavelengths. An electrostatic pull, applied through the potential difference, deflect the movable FPI reflector 1504 away from the substrate 116 and towards the fixed FPI reflector 1502. The FPI gap shrinks and the spectral location of the resonance peak is shifted towards smaller wavelengths.

Figure 16:
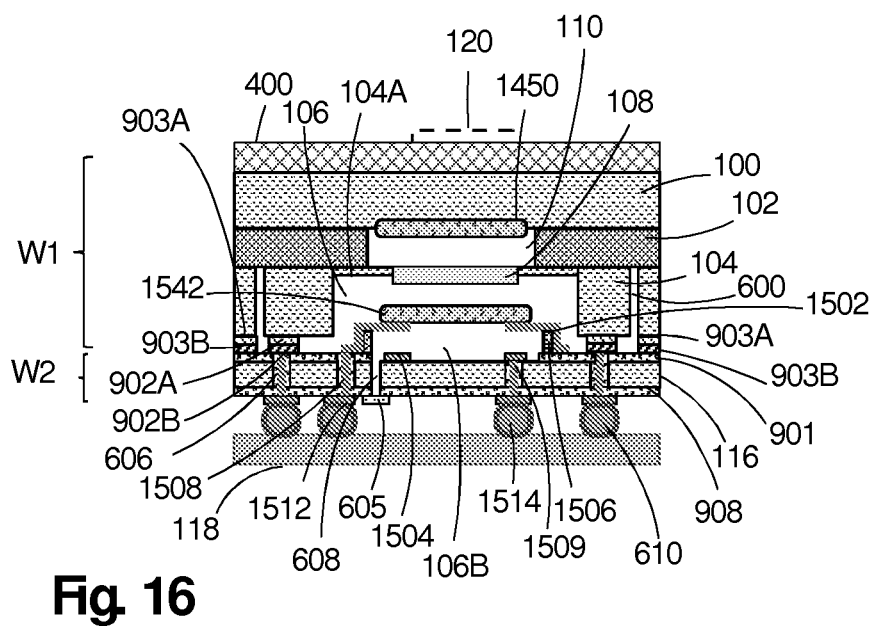
FIG. 16 shows a more-detailed schematic representation of an exemplary suspended detector 20 according to an aspect of FIG. 14B using thermocompression wafer bonding.

FIG. 16 show a more-detailed schematic representation of an exemplary suspended detector 20 according to an aspect of FIG. 14B using thermocompression bonding or another type of metal-based wafer bonding.

The wafer W1 may be substantially similar to that described above with reference to FIG. 15, except for that A patterned bonding material layer of a first bonding material may be provided on the inner surface of the wafer W1, and a corresponding patterned bonding material layer of a second bonding material may be provided on the inner surface of the wafer W1. For example, a first plurality of bonding metal bumps or pads or leads 902A, 903A may be provided on the inner surface of the wafer W1, and a matching second plurality of bonding metal bumps or pads or leads 902B, 903B may be provided on the inner surface of the wafer W2. In the exemplary embodiment illustrated in FIGS. 9A-9C, the patterned bonding material layers are shown to be made of different materials but both bonding material layer can be of the same material. Examples of suitable bonding material pairs were given above with reference to FIGS. 9A-9C.

The second wafer W2 may be substantially similar to that described above with reference to FIG. 15, except for that an insulating layer 901 (e.g. SiO2) deposited on the inner side of the substrate 116. The insulating layer 901 may provide an electrical insulation between the wafers W1 and W2. Alternatively, an insulation layer may be provided on the inner side of the support layer 104 on wafer W1 instead of or in addition to the insulating layer 901 on the wafer W2. The electrical insulating may alternatively be arranged by appropriately located trenches, or a combination of trenches and insulating layers. The second wafer W2 may include a dielectric or semiconducting substrate 116 and a movable SPI reflector (mirror) 1452 supported on the inner side of the substrate 116. In the exemplary embodiment illustrated in FIG. 16, the movable FPI reflector 1452 may be supported by electrically-conducting connection elements 1502 projecting inwards from the inner side of the insulating layer 901 so that the vacuum cavity 106b is configured between the back side of the movable FPI reflector and the inner side of the substrate 116. The connection elements 1502 and/or movable FPI reflector 1452 may be arranged to initially lie on top of a patterned local sacrificial layer deposited on the back side of the substrate, the sacrificial layer supporting and protecting the connecting elements 1502 and the movable FPI reflector 1452 during fabrication process. The sacrificial layer may be removed at least at the location of the movable reflector 1452 to release the movable FPI reflector 1452 before the complete wafer-level fabrication process ends, for example before the final vacuum sealing, preferably at the same time with the release of the suspended active element 108. The vacuum-sealed cavity 106b may be provided in place of a removed portion of the sacrificial layer between the movable FPI reflector 1452 and the substrate 116. A portion of the sacrificial layer 1506 may be left under the free ends of the connection elements 1502 to strengthen the support structure. The conductive elements or layer or wiring may be made of any conductive material, such as metal or other conductive material, e.g. poly-Si. The connections elements 1502 may provide first electrodes for moving or actuation of the movable FPI reflector 1452. In embodiments, the actuation may comprise an electrostatic actuation. In the illustrated example, further connecting layer or electrodes 1504 for electrostatic actuation may deposited on the inner side of the substrate 116 on the bottom of the vacuum cavity 106*b*. Alternatively, the substrate 116 may be used as a lower electrode for electrostatic actuation, if it is made of electrically conducting material, such as poly-Si.

The wafers W1 and W2 may be bonded together using thermocompression bonding or another type of metal-based wafer bonding. In the illustrated example, the matching bonding material layer of the facing inner sides or surfaces of the wafers W1 and W2 are bonded together to form a detector chip 20.

In embodiments of the invention, the electrical connections to the suspended active element 108 may comprise through substrate vias (TSVs) 906 that may be etched to extend from the outer surface of the substrate 116 to the inner surface of the insulating layer 901 to contact the bonding material patterns 902B. Similarly, through substrate vias (TSVs) 1508 and 1509 may be provided for the actuation electrodes 1502 and 1504, respectively. In embodiments, an insulating coating may be deposited on the through substrate vias (TSVs) 906, 1508 and 1509. In embodiments, an insulating layer 908 may be deposited on the backside of the substrate 116.

In embodiments, the through substrate vias (TSVs) 906, 1508 and 1509 may be filled, e.g. deposited, with an electrically conducting material to provide an electrical connection to the patterned bonding material layer, e.g. bonding metal bumps 902B, and to the actuation electrodes 1502 and 1504, respectively. Further, electrically conducting layer contacts 907 may be deposited on the outer or back side of the wafer W2, preferably on the insulating layer 908, at the locations of the through substrate vias (TSVs) 906, 1508 and 1509. Further, a vacuum sealing layer 605 may be deposited on the outer or back side of the wafer W2, such as on the insulating layer 908. The vacuum sealing layer 605 may be deposited locally to seal the release holes, such as the hole 909.

The detector chip 20 with the FPI may be flip-chip bonded or otherwise connected to an integrated readout circuit ROIC 118, for example in a similar manner as in the example of FIG. 15.

In embodiments, suspended detector arrays with the FPI may be provided, for example in a similar manners as described above for the suspended detector arrays without the FPI.

In embodiments of the invention, at least one of the wafers W1 and W2 may comprise a prefabricated intermediate product including one or more of the fixed FPI reflector, the movable FPI reflector, the support structure for the movable FPI reflector, the suspended active device, the support structure for the suspended active device, and the sacrificial layer for supporting the suspended active device.

The invention and its embodiments are not limited to the examples described above but may vary within the scope of the claims.

The invention claimed is:

1. A wafer-level integrated thermal detector, comprising a first wafer and a second wafer bonded together, wherein the first wafer includes a dielectric or semiconducting substrate, a wafer-wide or patterned local dielectric or semiconducting sacrificial layer deposited on the substrate, a support layer deposited on the dielectric or semiconducting sacrificial layer, a suspended active element provided within an opening in the support layer, a first vacuum-sealed cavity and a second vacuum-sealed cavity on opposite sides of the suspended active element, wherein the first vacuum-sealed cavity extends into the sacrificial layer at the location of the suspended active element, and the second vacuum-sealed cavity comprises the opening of the support layer closed by the bonded second wafer, front optics for entrance of radiation from outside into one of the first and second vacuum-sealed cavities, a back reflector arranged to reflect radiation back into the other one of the first and second vacuum-sealed cavities, the back reflector comprising one or more of: a Distributed Bragg reflector, a controllable moving back mirror, a Fabry-Perot interferometer, a tuneable Fabry-Perot interferometer, and a back reflector made of doped semiconductor material, and electrical connections for connecting the suspended active element to a readout circuit.

2. An integrated thermal detector according to claim 1, wherein the wafer bonded first and second wafers comprise fusion-activated wafer bonded first and second wafers or thermocompression wafer bonded first and second wafers or metal-based wafer bonded first and second wafers.

3. An integrated thermal detector according to claim 1, wherein the electrical connections are configured to be connected to an integrated readout circuit on a third wafer, by a thermocompression bonding or another type of metal-based bonding or a chip bonding.

4. An integrated thermal detector according to claim 1, wherein the front optics comprises one or more of: a transparent substrate, a window in a substrate, an anti-reflective coating, a lens, a filter, a front mirror, a controllable moving front mirror, a Fabry-Perot interferometer, a tuneable Fabry-Perot interferometer.

5. An integrated thermal detector according to claim 1, wherein the back reflector is provided on an inner side of the first wafer, or on outer side of the other one of the second wafer behind a transparent substrate or a window, or in an opening provided in the second wafer.

6. An integrated thermal detector according to claim 1, wherein the support layer further comprises a shoulder portion on a periphery of the opening for mechanical and electrical connection of the suspended active element, wherein a layer thickness of the shoulder portion is smaller than a layer thickness of the remaining portion of the support layer, and wherein the thinner shoulder portion is preferably offset from a bonded surface of the first wafer.

7. An integrated thermal detector according to claim 1, wherein the back reflector is provided on an inner side of the second wafer, or on an outer side of first wafer behind a transparent substrate or a window, or in an opening provided in the first wafer.

8. An integrated thermal detector according to claim 1, comprising a movable reflector of a Fabry-Pérot interferometer in one of the first and second vacuum-sealed cavities, wherein a vacuum space is present on both sides of the movable reflector.

9. An integrated thermal detector chip according to claim 8, wherein both a fixed reflector and the movable reflector of the Fabry-Pérot interferometer are arranged in the same one of the first and second vacuum-sealed cavities on a front side of the suspended active element, the front side facing to a direction of the front optics.

10. An integrated thermal detector according to claim 8, wherein the movable reflector is arranged in the one of the first and second vacuum-sealed cavities on a back side of the suspended active element, the back side facing to a direction of the back reflector.

11. An integrated thermal detector according to claim 10, wherein the movable reflector is configured to operate as said back reflector.

12. An integrated thermal detector according to claim 10, wherein a fixed reflector of the Fabry-Pérot interferometer is arranged on a front side of the suspended active element, the front side facing to a direction of the front optics.

13. An integrated thermal detector according to claim 8, comprising a support structure arranged to mechanically support the movable reflector within the one of the first and second vacuum-sealed cavities.

14. An integrated thermal detector according to claim 8, comprising electrical connections arranged to connect the movable reflector to an actuation control for tuning the Fabry-Pérot interferometer.

15. An integrated thermal detector according to claim 14, wherein the electrical connections of the movable reflector comprise a pair of electrostatic actuation electrodes.

16. An integrated thermal detector according to claim 15, wherein the thermal detector is arranged to absorb electromagnetic radiation in one of the following wavelength ranges: ultraviolet (UV) light, visible light, infrared (IR) light, Tera-Hertz (THz) radiation, and X-rays.

17. An integrated thermal detector according to claim 1, wherein the doped semiconductor material comprises single-crystalline silicon or polycrystalline silicon.

18. A wafer-level integrated thermal detector array comprising a plurality of wafer-level integrated thermal detectors, each wafer-level integrated thermal detector comprising
   a first wafer and a second wafer bonded together, wherein the first wafer includes a dielectric or semiconducting substrate, a wafer-wide or patterned local dielectric sacrificial layer deposited on the substrate, a support layer deposited on the dielectric or semiconducting sacrificial layer, a suspended active element provided within an opening in the support layer,
   a first vacuum-sealed cavity and a second vacuum-sealed cavity on opposite sides of the suspended active element, wherein the first vacuum-sealed cavity extends into the sacrificial layer at the location of the suspended active element, and the second vacuum-sealed cavity comprises the opening of the support layer closed by the bonded second wafer,
   front optics for entrance of radiation from outside into one of the first and second vacuum-sealed cavities,
   a back reflector arranged to reflect radiation back into the other one of the first and second vacuum-sealed cavities, the back reflector comprising one or more of: a Distributed Bragg reflector, a controllable moving back mirror, a Fabry-Perot interferometer, a tuneable Fabry-Perot interferometer, and a back reflector made of doped semiconductor material, and electrical connections for connecting the suspended active element to a readout circuit.

19. A wafer-level integrated thermal detector array according to claim 18, wherein the doped semiconductor material comprises single-crystalline silicon or polycrystalline silicon.

20. A prefabricated intermediate product for manufacture of a wafer-level integrated thermal detector or an array of wafer-level integrated thermal detectors, each wafer-level integrated thermal detector comprising
   a first wafer and a second wafer bonded together, wherein the first wafer includes a dielectric or semiconducting substrate, a wafer-wide or patterned local dielectric sacrificial layer deposited on the substrate, a support layer deposited on the dielectric or semiconducting sacrificial layer, a suspended active element provided within an opening in the support layer,
   a first vacuum-sealed cavity and a second vacuum-sealed cavity on opposite sides of the suspended active element, wherein the first vacuum-sealed cavity extends into the sacrificial layer at the location of the suspended active element, and the second vacuum-sealed cavity comprises the opening of the support layer closed by the bonded second wafer,
   front optics for entrance of radiation from outside into one of the first and second vacuum-sealed cavities,
   a back reflector arranged to reflect radiation back into the other one of the first and second vacuum-sealed cavities, and
   electrical connections for connecting the suspended active element to a readout circuit
   wherein the intermediate product comprising the first wafer prefabricated to include the substrate, the suspended active device, the support layer, and the dielectric sacrificial layer supporting the suspended active device, and wherein the first wafer is further prefabricated to include a Fabry-Perot interferometer, a fixed reflector of a Fabry-Perot interferometer, or a movable reflector of a Fabry-Perot interferometer on the inner side of the first wafer.

21. A prefabricated intermediate product for manufacture of a wafer-level integrated thermal detector or an array of wafer-level integrated thermal detectors, each wafer-level integrated thermal detector comprising
   a first wafer and a second wafer bonded together, wherein the first wafer includes a dielectric or semiconducting substrate, a wafer-wide or patterned local dielectric sacrificial layer deposited on the substrate, a support layer deposited on the dielectric or semiconducting sacrificial layer, a suspended active element provided within an opening in the support layer,
   a first vacuum-sealed cavity and a second vacuum-sealed cavity on opposite sides of the suspended active element, wherein the first vacuum-sealed cavity extends into the sacrificial layer at the location of the suspended active element, and the second vacuum-sealed cavity comprises the opening of the support layer closed by the bonded second wafer,
   front optics for entrance of radiation from outside into one of the first and second vacuum-sealed cavities,
   a back reflector arranged to reflect radiation back into the other one of the first and second vacuum-sealed cavities, and
   electrical connections for connecting the suspended active element to a readout circuit
   wherein the intermediate product comprising the second wafer prefabricated to include a dielectric or semiconducting substrate and a movable reflector of a Fabry-Perot interferometer on the inner side of the second wafer.

\* \* \* \* \*